(12) United States Patent
Timans

(10) Patent No.: US 8,918,303 B2
(45) Date of Patent: *Dec. 23, 2014

(54) SYSTEM AND PROCESS FOR CALIBRATING PYROMETERS IN THERMAL PROCESSING CHAMBERS

(71) Applicant: Mattson Technology, Inc., Fremont, CA (US)

(72) Inventor: Paul Janis Timans, Mountain View, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/625,161

(22) Filed: Sep. 24, 2012

(65) Prior Publication Data

US 2013/0028286 A1 Jan. 31, 2013

Related U.S. Application Data

(60) Continuation of application No. 13/109,577, filed on May 17, 2011, now Pat. No. 8,296,091, which is a division of application No. 12/787,165, filed on May 25, 2010, now Pat. No. 7,957,926, which is a continuation of application No. 10/178,950, filed on Jun. 24, 2002, now Pat. No. 7,734,439.

(51) Int. Cl.
*G01J 5/02* (2006.01)
*G01J 5/08* (2006.01)
*G01J 5/52* (2006.01)
*G01J 5/58* (2006.01)
*H01L 21/67* (2006.01)
*H01L 21/324* (2006.01)
*G01J 5/06* (2006.01)
*G01J 5/00* (2006.01)

(52) U.S. Cl.
CPC .............. *G01J 5/58* (2013.01); *G01J 2005/065* (2013.01); *G01J 5/089* (2013.01); *G01J 5/522* (2013.01); *G01J 5/0803* (2013.01); *G01J 5/0821* (2013.01); *G01J 5/06* (2013.01); *G01J 5/0831* (2013.01); *H01L 21/67115* (2013.01); *H01L 21/67248* (2013.01); *G01J 5/0285* (2013.01); *G01J 5/0846* (2013.01); *H01L 21/324* (2013.01); *G01J 2005/0048* (2013.01); *G01J 5/08* (2013.01); *G01J 5/0003* (2013.01); *G01J 5/0007* (2013.01)
USPC ........................................................... 702/99

(58) Field of Classification Search
USPC .......................................................... 702/99
See application file for complete search history.

(56) References Cited

U.S. PATENT DOCUMENTS 2,792,484 A 5/1957 Gurewitsch et al.
4,764,026 A 8/1988 Powell et al.
(Continued)

OTHER PUBLICATIONS

An110, Application Notes, "Radiation Thermometry in Molecular Beam Epitaxy", 1998, pp. 1-8.

(Continued)

*Primary Examiner* — Tung S Lau
(74) *Attorney, Agent, or Firm* — Dority & Manning, P.A.

(57) ABSTRACT

A method and system for calibrating temperature measurement devices, such as pyrometers, in thermal processing chambers are disclosed. According to the present invention, the system includes a calibrating light source that emits light energy onto a substrate contained in the thermal processing chamber. A light detector then detects the amount of light that is being transmitted through the substrate. The amount of detected light energy is then used to calibrate a temperature measurement device that is used in the system.

14 Claims, 11 Drawing Sheets

(56) References Cited

U.S. PATENT DOCUMENTS

| | | | |
|---|---|---|---|
| 4,841,150 A | 6/1989 | Walter | |
| 4,890,245 A | 12/1989 | Yomoto et al. | |
| 4,890,933 A | 1/1990 | Amith et al. | |
| 5,098,199 A | 3/1992 | Amith | |
| 5,118,200 A | 6/1992 | Kirillow et al. | |
| 5,167,452 A | 12/1992 | Amith et al. | |
| 5,170,041 A | 12/1992 | Amith et al. | |
| 5,180,226 A | 1/1993 | Mosiehi | |
| 5,208,643 A | 5/1993 | Fair | |
| 5,229,303 A | 7/1993 | Donnelly, Jr. et al. | |
| 5,258,602 A | 11/1993 | Naselli et al. | |
| 5,308,161 A | 5/1994 | Stein | |
| 5,350,899 A | 9/1994 | Ishikawa et al. | |
| 5,388,909 A | 2/1995 | Johnson et al. | |
| 5,467,732 A | 11/1995 | Donnelly, Jr. et al. | |
| 5,508,934 A | 4/1996 | Mosichi et al. | |
| 5,568,978 A | 10/1996 | Johnson et al. | |
| 5,683,180 A | 11/1997 | De Lyon et al. | |
| 5,773,316 A | 6/1998 | Kurosaki et al. | |
| 5,820,942 A | 10/1998 | Singh et al. | |
| 5,830,277 A | 11/1998 | Johnsgard et al. | |
| 5,874,711 A | 2/1999 | Champetier et al. | |
| 5,930,456 A | 7/1999 | Vosen | |
| 5,960,158 A | 9/1999 | Gat et al. | |
| 5,970,214 A | 10/1999 | Gat | |
| 5,970,382 A | 10/1999 | Shah | |
| 5,980,637 A | 11/1999 | Singh et al. | |
| 5,997,175 A | 12/1999 | Champetier et al. | |
| 6,027,244 A | 2/2000 | Champetier et al. | |
| 6,034,357 A | 3/2000 | Guardado | |
| 6,056,434 A | 5/2000 | Champetier | |
| 6,062,729 A | 5/2000 | Ni et al. | |
| 6,074,087 A | 6/2000 | Chen et al. | |
| 6,075,922 A | 6/2000 | Tay et al. | |
| 6,082,892 A | 7/2000 | Adel et al. | |
| 6,116,779 A | 9/2000 | Johnson et al. | |
| 6,121,580 A | 9/2000 | Tsukamoto | |
| 6,130,415 A | 10/2000 | Knoot | |
| 6,151,446 A | 11/2000 | Hunter et al. | |
| 6,158,310 A | 12/2000 | Goss et al. | |
| 6,160,242 A | 12/2000 | Guardado | |
| 6,168,311 B1 | 1/2001 | Xiao et al. | |
| 6,174,081 B1 | 1/2001 | Holm | |
| 6,174,651 B1 | 1/2001 | Thakur | |
| 6,200,023 B1 | 3/2001 | Tay et al. | |
| 6,200,634 B1 | 3/2001 | Johnsgard et al. | |
| 6,204,484 B1 | 3/2001 | Tay et al. | |
| 6,210,484 B1 | 4/2001 | Hathaway | |
| 6,222,990 B1 | 4/2001 | Guardado et al. | |
| 6,281,141 B1 | 8/2001 | Das et al. | |
| 6,284,048 B1 | 9/2001 | Van Bilsen et al. | |
| 6,293,696 B1 | 9/2001 | Guardado | |
| 6,310,328 B1 | 10/2001 | Gat | |
| 6,359,263 B2 | 3/2002 | Tay et al. | |
| 6,369,363 B2 | 4/2002 | Hauf et al. | |
| 6,403,923 B1 | 6/2002 | Tay et al. | |
| 6,514,876 B1 | 2/2003 | Thakur et al. | |
| 6,515,261 B1 | 2/2003 | Smargiassi et al. | |
| 6,559,424 B2 | 5/2003 | O'Carroll et al. | |
| 6,561,694 B1 | 5/2003 | Lerch et al. | |
| 6,610,967 B2 | 8/2003 | Gat | |
| 6,638,876 B2 | 10/2003 | Levy et al. | |
| 6,647,350 B1 | 11/2003 | Palfenier et al. | |
| 6,679,946 B1 | 1/2004 | Jackson et al. | |
| 6,717,158 B1 | 4/2004 | Gat et al. | |
| 6,727,474 B2 * | 4/2004 | Gat ............................. 219/390 | |
| 6,830,942 B1 | 12/2004 | Alers et al. | |
| 6,891,124 B2 | 5/2005 | Denton et al. | |
| 7,112,763 B2 | 9/2006 | Hunter et al. | |
| 2001/0002668 A1 * | 6/2001 | Gat ............................. 219/390 | |
| 2002/0005400 A1 | 1/2002 | Gat | |
| 2002/0017618 A1 | 2/2002 | Gat et al. | |
| 2002/0104619 A1 | 8/2002 | Koren et al. | |
| 2002/0137311 A1 | 9/2002 | Timans | |
| 2002/0185053 A1 | 12/2002 | Fei et al. | |
| 2003/0031793 A1 | 2/2003 | Chang et al. | |
| 2003/0124820 A1 | 7/2003 | Johnsgard et al. | |
| 2003/0209326 A1 | 11/2003 | Lee et al. | |
| 2003/0235983 A1 | 12/2003 | Li et al. | |
| 2004/0061057 A1 | 4/2004 | Johnson et al. | |
| 2006/0086713 A1 | 4/2006 | Hunter et al. | |

OTHER PUBLICATIONS

Definition of Micrometer, www.pcmag.com/encyclopedia_term/0.2542,t=micrometer&i-46949,00.asp, Aug. 7, 2006, p. 1.

Definition of Spectrometer, en.wikipedia.org/wiki/Spectroscope, Aug. 7, 2006, pp. 1-3.

Nitto Technical Report, vol. 38, Dec. 2, 2000, pp. 42-44.

Adel et al., "Noncontact Temperature Monitoring of Semiconductors by Optical Absorption Edge Sensing", SPIE, vol. 1803, 1992, pp. 290-298.

Balmer et al., "Substrate Temperature Reference Using SiC Absorption Edge Measured by In Situ Spectral Reflectometry", Journal of Crystal Growth, vol. 248, 2003, pp. 216-221.

Birman et al., "Control of Temperature Gradients and Distortion of Ion Projection Lithography Masks", The Journal of Vacuum Science & Technology B., vol. 13, No. 6, Nov./Dec. 1995, pp. 2584-2587.

Booth et al., "In Situ Wafer Temperature Monitoring of Silicon Etching Using Diffuse Reflectance Spectroscopy", Journal of Vacuum Science Technology A, vol. 14, No. 4, Jul./Aug. 1996, pp. 2356-2360.

Cardoso et al., "Improvements in Wafer Temperature Measurements", The Journal of Vacuum Science & Technology B., vol. 19, No. 2, Mar./Apr. 2001, pp. 397-402.

Chan, "Section I Circuits" the Electrical Engineering Handbook, Boca Raton, CRC Press LLC 2000, section equation 1.18-1.20, Defining Terms.

de Lyon et al., "Substrate Temperature Measurement by Absorption-Edge Spectroscopy During Molecular Beam Epitaxy of Narrow-Band Gap Semiconductor Films," Journal of Vacuum Science Technology B. vol. 15, No. 2, Mar./Apr. 1997, pp. 329-336.

Donnelley et al., "Infrared-Laser Interferometric Thermometry: A Nonintrusive Technique for Measuring Semiconductor Wafer Temperatures", Journal of Vacuum Science Technology A, vol. 8, No. 1, Jan./Feb. 1990, pp. 84-92.

Friberg et al., "Optical Measurement of Temperature with Single-Crystal Silicon", Review of Scienctific Instruments, vol. 60, No. 8, Aug. 1989, pp. 2764-2767.

Hellman et al., "Infra-Red Transmission Spectroscopy of GaAs During Molecular Beam Epitaxy", Journal of Crystal Growth, vol. 81, 1987, pp. 38-42.

Huldt et al., "Infrared Absorption of Free Carriers in Silicon", Proceedings of Conference on Semiconductor Physics, vol. 25, pp. 385-388.

Jellison et al., "Optical Absorption Coefficient of Silicon at 1.152µ at Elevated Temperatures", Applied Physics Letter, vol. 41, No. 7, Oct. 1, 1982, pp. 594-596.

Jeste, "Specific PVMAT R&D on Siemens CZ Silicon Product Manufacturing", IEEE 2000, pp. 1399-1402.

Johnson et al., "Closed-Loop Control of Composition and Temperature during the Growth of InGaAs Lattice Matched to InP", Journal of Vacuum Science Technology B, vol. 17, No. 3, May/Jun. 1999, pp. 1237-1240.

Johnson et al., Effect of Substrate Thickness, Back Surface Texture, Reflectivity, and Thin Film Interference on Optical Band-Gap Thermometry, Journal of Crystal Growth, vol. 175/176, 1997, pp. 273-280.

Johnson et al., "In Situ Temperature control of Molecular Beam Epitaxy Growth Using Band-Edge Thermometry", Journal of Vacuum Science Technology B., vol. 16, No. 3, May/Jun. 1998, pp. 1502-1506.

Johnson et al., "Semiconductor Substrate Temperature Measurement by Diffuse Reflectance Spectroscopy in Molecular Beam Epitaxy", Journal of Vacuum Science Technology B., vol. 11, No. 3, May/Jun. 1993, pp. 1007-1010.

Katzer et al., "Comparison of Optical Pyrometry and Infrared Transmission Measurements on Indium-Free Mounted Substrates During

(56) References Cited

OTHER PUBLICATIONS

Molecular-Beam Epitaxial Growth", Journal of Vacuum Science Technology B., vol. 11, No. 3, May/Jun. 1993, pp. 1003-1006.

Kyuma et al., "Fiber-Optic Instrument for Temperature Measurement", IEEE Journal of Quantum Electronics, vol. 18, 1982, p. 676.

Lee et al., "Accurate Measurement of MBE Substrate Temperature", Journal of Crystal Growth, vol. 111, 1991, pp. 131-135.

Malam et al., "Noninvasive Infrared-Based Measurement of the Temperature of GaAs Semiconductor Crystals", Journal of Vacuum Science Technology A, vol. 12, No. 5, Sep./Oct. 1994, pp. 2938-2939.

Palik et al., "Fabrication and Characterization of Si Membranes", Journal of the Electrochemical Society, vol. 135, No. 12, Dec. 1988, pp. 3126-3134.

Pearsall et al., Precision of Noninvasive Temperature Measurement by Diffuse Reflectance Spectroscopy, Review of Scientific Instruments., vol. 66, No. 10, Oct. 1995, pp. 4977-4980.

Peyton et al., "Systems-Oriented Survey of Non-Contact Temperature Measurement techniques for Rapid Thermal Processing", SPIE—Rapid Thermal and Related Processing Techniques, vol. 1393, 1990, pp. 295-308.

Riordan et al., "Stencil Mask Temperature Measurement and Control During Ion Irradiation", the Journal of Vacuum Science & Technology B., vol. 14, No. 6, Nov./Dec. 1996, pp. 3900-3902.

Schmid, "Optical Absorption in Heavily Doped Silicon", Physical Review B, vol. 23, No. 10, May 15, 1981, pp. 5531-5536.

Shanabrook et al., "Variations in Substrate Temperature Induced by Molecular-Beam Epitaxy Growth on Radiatively Heated Substrates", Science of Technology B, vol. 11, No. 3, May/Jun. 1993, pp. 994-997.

Sturm et al., "Silicon temperature Measurement by Infrared Absorption: Fundamental Process and Doping Effects", IEEE Transactions on Electron Devices, vol. 39, No. 1, Jan. 1992, pp. 81-88.

Sturm et al., "Silicon Temperature Measurement by Infrared Transmission for Rapid Thermal Processing Applications", Applied Physics Letter, vol. 56, Mar. 5, 1990, pp. 961-963.

Svensson et al., "Performance Evaluation of the Commercial Point of Inflection Thermometry Substrate Temperature Monitor", The Journal of Vacuum Science & Technology B., vol. 14, No. 3, May/Jun. 1996, pp. 2166-2169.

Thibado et al., "Robust Optical Delivery System for Measuring Substrate Temperature During Molecular Beam Epitaxy", Journal of Vacuum Science Technology B., vol. 17, No. 1, Jan./Feb. 1999, pp. 253-256.

Thompson et al., "Diffuse Reflectance Spectroscopy Measurement of Substrate Temperature and Temperature Transient During Molecular Beam Epitaxy and Implications for Low-Temperature III-V Epitaxy", Applied Physics Letters, vol. 70, No. 12, Mar. 24, 1997, pp. 1605-1607.

Timans et al., "Emissivity of Silicon at Elevated Temperatures", Journal of Applied Physics., vol. 74, No. 10, Nov. 15, 1993, pp. 6353-6364.

Timans et al., "The Experimental Determination of the Temperature Dependence of the Total Emissivity of GaAs Using a New Temperature Measurement Technique", Journal of Applied Physics, vol. 72, Jul. 15, 2991, pp. 660-670.

Vavilov et al., "A Method for Studying Thermal Reflection in Semiconductors", Soviet Physics—Solid State, vol. 12, No. 6, Dec. 1970, pp. 1329-1331.

Wang et al., "Real-Time Noninvasive Temperature Control of Wafer Processing Based on Diffusive Reflectance Spectroscopy", Journal of Vacuum Science Technology B., vol. 15, No. 1, Jan./Feb. 1997, pp. 116-121.

Weider, "Laser Thermoprobe", Optics Communications, vol. 11, No. 3, Jul. 1974, pp. 301-304.

Weider, Novel Method for Measuring Transient Surface Temperatures with High Spatial and Temporal Resolution, Journal of Applied Physics, vol. 43, No. 7, Jul. 1972, pp. 3213-3214.

Weilmeier et al., "A New Optical Temperature Measurement Technique for Semiconductor Substrates in Molecular Beam Epitaxy", Journal of Physics, vol. 69, 1991, pp. 422-426.

www.m-w.com/dictionary/pyrometer, p. 1.

* cited by examiner

SYSTEM AND PROCESS FOR CALIBRATING PYROMETERS IN THERMAL PROCESSING CHAMBERS

PRIORITY CLAIM

This application is a continuation of and claims priority to U.S. patent application Ser. No. 13/109,577, filed on May 17, 2011, which is a divisional of and claims priority to U.S. patent application Ser. No. 12/787,165, filed on May 25, 2012, now U.S. Pat. No. 7,957,926, which is a continuation of and claims priority to U.S. patent application Ser. No. 10/178,950, filed on June 24, 2002, now U.S. Pat. No. 7,734,439. The foregoing patent applications and issued patents are incorporated herein by reference for all purposes.

BACKGROUND OF THE INVENTION

A thermal processing chamber as used herein refers to a device that rapidly heats objects, such as semiconductor wafers. Such devices typically include a substrate holder for holding one or more semiconductor wafers and an energy source for heating the wafers, such as heating lamps and/or an electrical resistance heater. During heat treatment, the semiconductor wafers are heated under controlled conditions according to a preset temperature regime.

Many semiconductor heating processes require a wafer to be heated to high temperatures so that various chemical and physical transformations can take place as the wafer is fabricated into a device. During rapid thermal processing, for instance, semiconductor wafers are typically heated by an array of lights to temperatures from about 300° C. to about 1,200° C., for times that are typically less than a few minutes. During these processes, one main goal is to heat the wafers as uniformly as possible.

During the rapid thermal processing of a semiconductor wafer, it is desirable to monitor and control the wafer temperature. In particular, for all of the high temperature wafer processes of current and foreseeable interest, it is important that the true temperature of the wafer be determined with high accuracy, repeatability and speed. The ability to accurately measure the temperature of a wafer has a direct payoff in the quality and size of the manufactured integrated circuit.

One of the most significant challenges in wafer heating systems is the ability to measure accurately the temperature of substrates during the heating process. In the past, various means and devices for measuring the temperature of substrates in thermal processing chambers have been developed. Such devices include, for instance, pyrometers, thermocouples that directly contact the substrate or that are placed adjacent to the substrate, and the use of laser interference.

In order to use pyrometers in a thermal processing chamber, the pyrometers generally need to be calibrated. Consequently, various calibration procedures currently exist to align the temperature readings of the pyrometers with an absolute and accurate temperature reference. The current state of the art and the most widely used method to calibrate pyrometers in thermal processing chambers is to place in the chambers a semiconductor wafer having a thermocouple embedded in the wafer. The temperature measurements taken from the thermocouple are compared with the temperature readings received from the temperature measuring devices and any discrepancy is calibrated out.

Although this method is well suited to calibrating temperature measuring device, such as pyrometers, it requires a substantial amount of time to calibrate the instruments. As such, a need currently exists for a method of calibrating pyrometers in thermal processing chambers very rapidly without creating a substantial amount of down time. In particular, a need exists for a method of calibrating pyrometers in thermal processing chambers without having to open the chamber, in order to maintain chamber integrity and purity. A need also exists for a simple method for calibrating pyrometers in thermal processing chambers that can be used routinely as a regular check to verify that the optical pyrometry system is properly functioning.

SUMMARY OF THE INVENTION

The present invention is directed to a process for calibrating a temperature measurement device in a thermal processing chamber. The process includes the steps of placing a calibration wafer within the thermal processing chamber. Light energy is emitted from a calibrating light source onto the calibration wafer while the wafer is being heated within the thermal processing chamber. For instance, the wafer can be heated using light energy and/or by using an electrical resistance heater. The amount of light energy emitted from the calibrating light source that is transmitted through the calibration wafer is detected. The temperature of the calibration wafer is then determined based upon the amount of transmitted light that is detected.

From this information, the temperature measurement device contained within the thermal processing chamber can be calibrated. The temperature measurement device can be, for instance, one or more pyrometers, one or more thermocouples, or any other suitable temperature measurement device.

During the process, the light energy that is transmitted through the calibration wafer is detected at one or more specific wavelengths. In general, the wavelength can be in the infra-red range. For instance, the detected wavelength can be from about 1 micron to about 2 microns. In one embodiment, transmitted light is detected at several wavelengths simultaneously. In an alternative embodiment, however, a first wavelength is used to detect the amount of light transmitted through the wafer at lower temperatures, while a second wavelength is used to determine the amount of light being transmitted through the wafer at higher temperatures. For example, the first wavelength can be shorter than the second wavelength. The second wavelength can be used to determine the temperature of the wafer at temperatures greater than about 700° C.

The calibrating light source used in the present invention can be a coherent light source or an incoherent light source. An example of a coherent light source is, for instance, a laser. Examples of incoherent light sources are, for instance, a tungsten halogen lamp or a light emitting diode.

The calibration wafer used in the process of the present invention can vary depending upon the particular application. In one embodiment, the calibration wafer is a silicon wafer. In order to reduce interference effects and to maximize the amount of light transmitted through the calibration wafer, the calibration wafer can include anti-reflective coatings applied to one or both surfaces of the wafer. For measurements at higher temperatures, the calibration wafer can also include thin areas where the transmission measurements are taken and the temperature measurements devices are calibrated.

When the calibration wafer includes a thin area, the thin area can be produced according to various methods. For instance, in one embodiment, the calibration wafer can define an opening. The thin area can comprise a thin member placed over the opening. Alternatively, the thin area can be integral with the remainder of the wafer.

In some embodiments, the thin area may produce temperature gradients during heating as a result of differences in thermal characteristics. Consequently, a coating can be placed over the calibration wafer that is designed to reduce the differences in thermal characteristics between the thin area and the remainder of the wafer.

The coating can be made from single or multi-layered films. The coating can contain, for instance, silicon, polysilicon, and/or silicon nitride. In one particular embodiment, the thin area can be filled with a fill member for reducing thermal mass differences. The fill member can be made from quartz or aluminum oxide such as sapphire.

It should be understood that the calibration wafer can be made from various materials. In one embodiment, for instance, the calibration wafer can be made from a substantially opaque material. Opaque materials are useful when calibrating pyrometers at lower temperatures. In this embodiment, the calibration wafer can further include areas made from transmissive materials, such as silicon. The silicon areas can be used to measure transmission, while the opaque areas can be aligned with the pyrometers.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
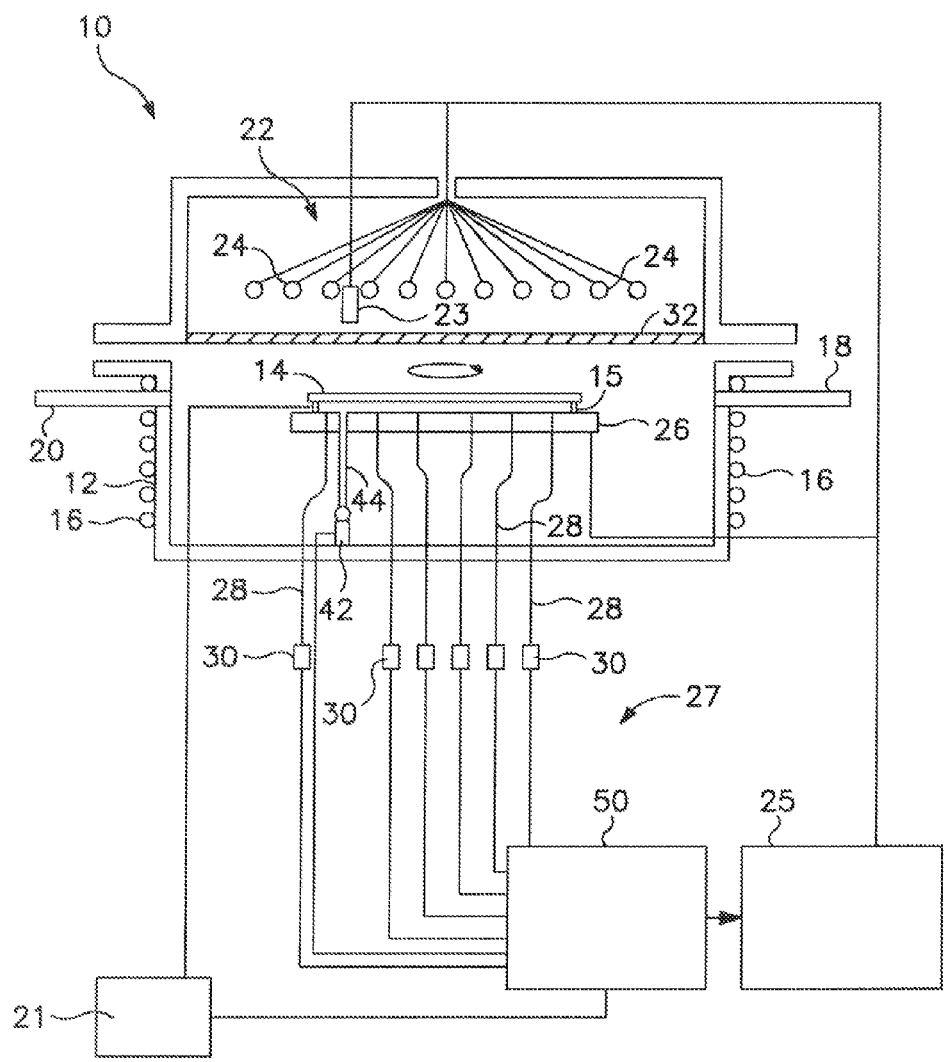
FIG. 1 is a side view of one embodiment of a system for calibrating temperature sensing devices in accordance with the present invention.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

The present invention is directed to a method and to a system for more accurately determining and controlling the temperature of an object, particularly a semiconductor wafer in a thermal processing chamber during heat treatment. More particularly, the present invention is directed to a method and system for calibrating temperature measuring devices contained within thermal processing chambers so that the thermal processing chamber will operate more repeatably and accurately. For instance, it is important that temperature sensing devices contained within thermal processing chambers accurately measure the temperature of semiconductor wafers as they are being heated. In this regard, the temperature sensing devices should be calibrated to ensure that they are accurately monitoring the temperature of the wafer.

In general, the method of the present invention for calibrating temperature sensing devices, particularly radiation sensing devices such as pyrometers, includes the step of placing in a thermal processing chamber a calibration wafer. A calibrating light source placed in the chamber is configured to emit light energy onto the calibration wafer at a known wavelength. Positioned on the opposite side of the wafer is a light detector that detects the amount of light being transmitted through the wafer by the calibrating light source. The temperature of the wafer is then calculated based on the amount of light that is transmitted through the wafer. This information is used to calibrate a temperature sensing device contained within the chamber which is used during normal wafer processing.

The present invention permits automatic calibration of a temperature measurement system through an automated procedure that is performed on a semiconductor wafer processing system. The temperature calibration method is based on an in-situ measurement of the transmission of infra-red light through the semiconductor wafer. The wafer processing apparatus incorporates a device for measuring a signal arriving from the infra-red light transmitted by the wafer as well as a temperature measurement system, such as a pyrometer system that is used during normal processing for temperature measurement and control. Knowledge of the temperature dependence of the optical properties of the wafer used for the calibration procedure is combined with the measured infra-red transmission signal to deduce the wafer temperature. The wafer temperature is used to calibrate a pyrometer system or other temperature measurement device.

A light source on one side of a calibration wafer is modulated in intensity, and a detector on the opposite side of the wafer detects a signal proportional to the amount of light transmitted through the wafer. The system incorporates a method for selecting the wavelength of the observed radiation. The transmitted signal depends on optical absorption within the wafer, which is a function of temperature. As a result, the wafer temperature can be deduced from the transmitted light signal.

The infra-red transmission measurement is arranged so that it occurs at a position on the wafer that is within the field of view or close to the field of view (within a few centimeters) of the pyrometer or other temperature measurement device. If the system allows for wafer rotation, it is also possible for the infra-red transmission measurement to be performed at the same radius or close to the same radius as the field of view of the pyrometer or temperature measurement device being calibrated. Provided that the wafer rotation is at a rate that is fast enough to create an azimuthally symmetric temperature distribution, the temperature sampled in the infra-red measurement is the same as that sampled by the pyrometer at the same particular radius. In one embodiment, the same fiber or optics that lead to the light detector for determining the amount of infra-red light being transmitted through the wafer can lead to the pyrometer, such as by splitting the signal optically.

Calibration of the temperature measurement device can be performed through an automated procedure where wafers are loaded automatically and a calibration recipe heats the wafer through a prescribed temperature-time cycle and data is acquired by the infra-red transmission system and pyrometer system. The procedure can include a stage where the measurement is taken with the wafer at a temperature where its transmission is known and it is not highly sensitive to temperature. This allows the signal to be corrected so that the transmission measurement is not highly sensitive to changes in the optical characteristics of the transmission measurement system or the calibration wafer.

The transmission signal is interpreted as a temperature by an algorithm that takes account of the properties of the wafer being used for the calibration. The algorithm can accept information regarding the thickness of the wafer, the wavelength of light being used for calibration and other parameters that help improve the accuracy of the temperature value deduced from the transmission signal.

The process for calibrating the temperature measurement device can also include a step in which measurements using the transmission system occur before a wafer is loaded into the thermal processing chamber. The ratio of the transmission signal with a wafer in place as compared to that without a wafer provides an estimate of the transmissivity of the wafer. The measured transmissivity of the wafer can then be used to ensure that the correct wafer was loaded and to test for degradation of the wafer. The transmission signal level when there is no wafer present is also a useful indicator of the status of the optical system for transmission measurements.

The method and system of the present invention offer various advantages and benefits. For instance, the present invention offers a relatively simple method for quickly calibrating the radiation sensing devices. The calibrations can be performed automatically between wafers or wafer lots by placing a calibration wafer into the thermal processing chamber when desired. Further, the calibration wafer can be loaded and removed from the thermal processing chamber using the same mechanism that moves and transports the wafers.

The present invention allows for the calibration of radiation sensing devices in thermal processing chambers according to a relatively simple method that does not require substantial interference with the operation of the chamber. The present invention can be used to calibrate single or multi-point pyrometric systems. Further, the method and system of the present invention permit calibration without having to incorporate a thermocouple instrumented wafer as was done in the past.

Figure 3:
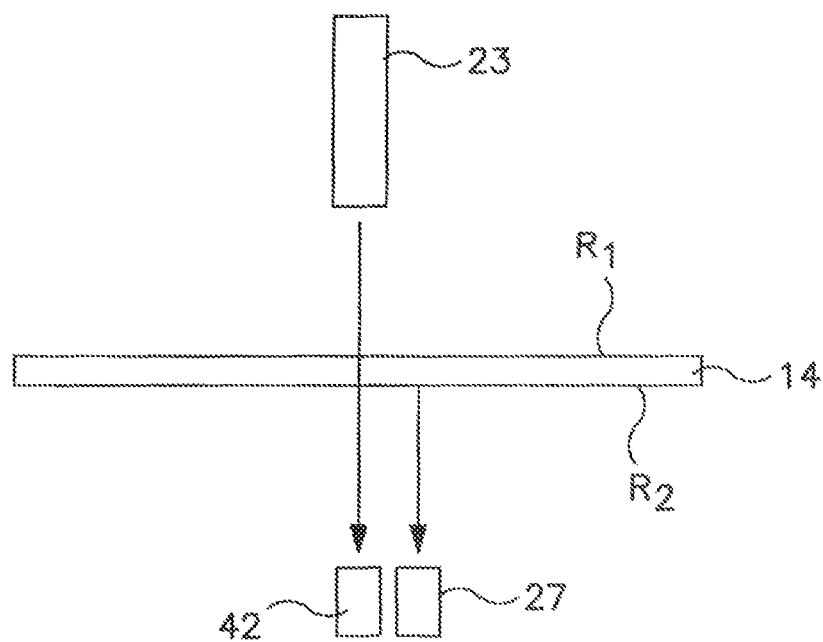
FIG. 3 is a side view of one embodiment of a system made in accordance with the present invention.

Referring now to FIG. 3, one embodiment of a simplified diagram of the present invention is illustrated. As shown, the system includes a semiconductor wafer 14 and a temperature measurement device 27, such as a pyrometer, that is normally used to monitor the temperature of the wafer. In order to calibrate the temperature measurement device 27, the system further includes a calibrating light source 23 which emits infra-red light onto the wafer 14 at a particular location. On the opposite side of the wafer is a light detector 42 which senses the amount of infra-red light that is being transmitted through the wafer 14.

Measurements of the transmissivity of the wafer can be used to determine the temperature because the absorption coefficient of silicon, $\alpha(\lambda,T)$ is a function of the wavelength of the radiation, $\lambda$, and the temperature T. The following discussion includes the mathematics relating the transmission measurements to $\alpha(\lambda,T)$.

A general wafer has various properties that need to be considered. The two surfaces of the wafer may have different reflectivities and transmissivities. Furthermore, the reflectivities of the surfaces may be different for radiation incident on them from outside the wafer, or from within the wafer. When a wafer is semi-transparent, multiple reflections of the various beams of energy propagating within the wafer affect its apparent reflectivity $R^*(\lambda,T)$ and transmissivity $S^*(\lambda,T)$ as observed from outside the wafer. The later quantities can be measured directly by optical measurements. In the calibration method, $S^*(\lambda,T)$ can be measured, because this quantity is the most sensitive to temperature (although $R^*(\lambda,T)$ can also be used for temperature measurements). In some texts, $R^*(\lambda,T)$ is called the reflectance and $S^*(\lambda,T)$ the transmittance.

In the discussion below, $T_t$ is the transmissivity of the top surface of the wafer, $T_b$ is the transmissivity of the bottom surface of the wafer, $R_{ts}$ is the reflectivity of the top surface of the wafer for radiation incident on it from within the substrate and $R_{bs}$ is the reflectivity of the bottom surface of the wafer for radiation incident on it from within the substrate. In general, if the incident radiation is not at normal incidence, all of the properties will be functions of the plane of polarization of the radiation. The quantity A is the attenuation in intensity experienced by a ray passing through the substrate, which is given by $$A = \exp(-\alpha(\lambda,T)d/\cos\theta) \tag{1}$$

Where d is the thickness of the substrate and $\theta$ is the internal angle of propagation. The latter angle is the angle between the direction of the ray and the normal to the wafer surface. The apparent transmissivity of the wafer is then given by the expression $$S^*(\lambda, T) = \frac{AT_tT_b}{1 - A^2R_{ts}R_{bs}} \tag{2}$$

The signal measured at the photodetector, V(T), in the apparatus is directly proportional to this quantity and to the intensity of the radiation incident on the wafer from the illuminating light source, $I_0$. The relationship is $$V(T) = CI_0S^*(\lambda,T) \tag{3}$$

Where C is a constant that is affected by the optics and electronics, but that does not vary with wafer temperature. In order to deduce the wafer temperature, the effects of the unknown quantities, including $I_0$ and C, from the measurements should be removed. This can be done in a number of ways. The optical properties of the wafer surfaces (such as their reflectivities and transmissivities) should also be taken into account. A "normalization" procedure can take care of these aspects. For example, the following are two approaches:

(a) Normalize to the case where the wafer is not present in the system:

In this case the transmissivity of the system becomes 1, because there is no wafer present to absorb or reflect any radiation. A normalization signal $V_{00}$ can be measured which is given by $$V_{00} = CI_0 \tag{4}$$

By dividing a "hot-wafer" signal V(T) by $V_{00}$, the effects of C and $I_o$ can be removed. The effects of the other quantities in $S^*(\lambda,T)$ still must be accounted for however. That can be done by knowing the optical properties of the wafer being used, including $T_t$, $T_b$, $R_{bs}$ and $R_{ts}$. In this regard, the wafer being used in the calibration procedure can be selected so that these quantities can be determined by making calculations based on the known film coatings on the surfaces of the wafer. The calculations can also be augmented by various optical measurements that can be made under controlled conditions. The absorption coefficient can then be obtained from the measured value of $S^*(\lambda,T)$ by solving for A in equation 1. Once A is known, it is possible to correct for the effect of the wafer thickness (which has been measured) and deduce $\alpha(\lambda,T)$. Since the function $\alpha(\lambda,T)$ is known, T can be deduced. This procedure also allows to correct for variations in the wavelength of the light source. The exact method of implementing this procedure could vary depending on the application. For instance, as one example one could create a set of matrices for $S^*(\lambda,T)$ with wafer thickness and source wavelength as parameters and T as a variable and then numerically identify a best value for T to fit the measured value of $S^*(\lambda,T)$.

The quantities $T_t$, $T_b$, $R_{bs}$ and $R_{ts}$ may themselves have temperature and wavelength dependences. For accuracy this effect could be taken into account in the analysis by explicitly including the known behaviour of the wafer surfaces. Again, the corrections are possible by using standard optical analysis to calculate $T_t$, $T_b$, $R_{bs}$ and $R_{ts}$ as functions of wavelength and temperature.

(b) Normalize to the case where the wafer is in a "cool" state:

In this case the normalization signal, $V_{01}$, is collected after the calibration wafer has been loaded into the system. $V_{01}$ is given by $$V_{01} = CI_0 S^*(\lambda, T_{cool}) \tag{5}$$

where $S^*(\lambda,T_{cool})$ is the wafer transmissivity at the "cool" temperature. That temperature would normally be any temperature where the absorption in the wafer at the calibration wavelength is negligible. In that case A~1, and we can write:

$$V_{01} = CI_0 \frac{T_t T_b}{1 - R_{ts} R_{bs}} \tag{6}$$

Now if a "hot-wafer" signal V(T) is normalized using $V_{01}$ we obtain the expression $$\frac{V(T)}{V_{01}} = \frac{AT_t T_b}{1 - A^2 R_{ts} R_{bs}} \cdot \frac{1 - R_{ts} R_{bs}}{T_t T_b} \tag{7}$$

If it is assumed that $T_t$ and $T_b$ do not depend on temperature, then this simplifies to $$\frac{V(T)}{V_{01}} = \frac{A(1 - R_{ts} T_{bs})}{1 - A^2 R_{ts} R_{bs}} \tag{8}$$

Further simplification can occur by examining the magnitude of the product $A^2 R_{ts} R_{bs}$ which appears in expression 8. This term is usually very small for two reasons. Firstly, for good temperature sensitivity there must be reasonably strong absorption within the wafer so A should be significantly below 1. Secondly, a wafer can be selected having rather small values for the reflectivity of the wafer surface at the transmission measurement wavelength. This can be done to maximize the transmitted light signal. Another practical point is that the interference effect observed when coherent light sources are used for illumination causes some problems in the measurements. By having a very small value for either $R_{ts}$ or $R_{bs}$ the problems identified above can be reduced. Furthermore, even for a plain silicon wafer, Rts=Rbs=~0.3, so $R_{ts} R_{bs}$ ~0.09. Thus, the term $R_{ts} R_{bs}$ is usually <<1. As a result, one can make the approximation of ignoring this term, as compared to unity, in the denominator of expression 8. This simplification leads to a simple form for the signal when normalized to the "cool" state $$\frac{V(T)}{V_{01}} \cong A(1 - R_{ts} R_{bs}) \tag{9}$$

if it is assumed that $R_{ts} R_{bs}$ is <<1 then the expression can further simplify to $$\frac{V(T)}{V_{01}} \cong A = \exp(-\alpha(\lambda, T)d) \tag{10}$$

The advantage of this approach is that, provided there is no significant temperature dependence in $T_t$ or $T_b$, it is not necessary to know the optical properties of the wafer surfaces. This can make the interpretation of the temperature more robust with respect to variations in the properties of coatings on the wafer and the texture of the surfaces.

The question of which normalization approach is better is driven by practicalities. The advantages of the case where the measurement is taken without the wafer present is that one doesn't have to worry about interference effects, which have their greatest impact in the "cold" state. The advantage of making the measurement with the wafer in the "cool" state is that there is automatic compensation for any small fluctuations in the surface reflectivities, transmissivities or texture effects.

Figure 22:
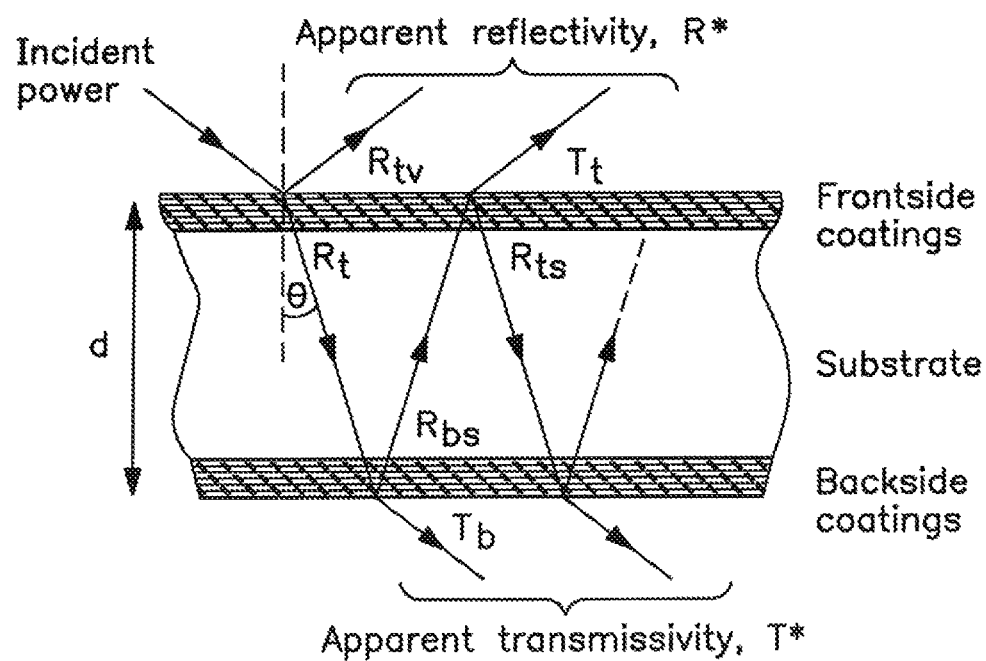
FIG. 22 is a cross-sectional diagrammatical view showing multiple reflections of light in between the outside surfaces of a wafer.

The analysis described above is all based on the assumption that the apparent reflectivity and transmissivity can be calculated by adding up the power contributions arising from the various rays undergoing multiple reflections illustrated in FIG. 22. This assumption is valid when there is no correlation between the electric fields associated with those rays. That is the case when the detected radiation covers an optical bandwidth which is a significant fraction (e.g. >0.001) of the "centre" wavelength, and the wafer is "optically thick", meaning its thickness corresponds to a large multiple (e.g. >100 times) of the wavelength of the light. These conditions correspond to the case when the light is regarded as "incoherent".

In the case where the light source is "coherent", typically the radiation being detected covers a very narrow range of wavelengths and/or the wafer is optically "thin". In that case there can be a strong correlation between the electric fields of the various rays propagating within the wafer. If this is the case summing up the power contributions does not reflect the correct physics. Instead, one needs to make a vector summation of the electric and magnetic fields of the electromagnetic waves associated with the rays undergoing the multiple reflections in order to obtain the correct apparent reflectivities and transmissivities. Under these conditions, the effect of the changes in the phase of the waves as they traverse the substrate becomes very important. If the fields for two wave components are added together in phase the effect is known as constructive interference because the resultant field is enlarged, if they are exactly out of phase this is known as destructive interference because the resultant field is reduced. These interference effects can have a major effect on the optical properties and furthermore they make them extremely sensitive to the phase-change that occurs, and hence to the wafer thickness, the wavelength of the radiation, the angle of incidence and the refractive index of the substrate.

This can be a problem, because it introduces very large variations in the detected signals which are not related to changes in the $\alpha(\lambda,T)$, the absorption coefficient of silicon. The problem is greatly reduced as absorption increases and the wafer becomes opaque, because the multiple reflections are greatly attenuated and most of the transmitted light intensity chiefly arises from light that passes through the substrate directly, so interference effects have little impact. Various methods are described below to mitigate problems arising from interference effects.

Figure 2:
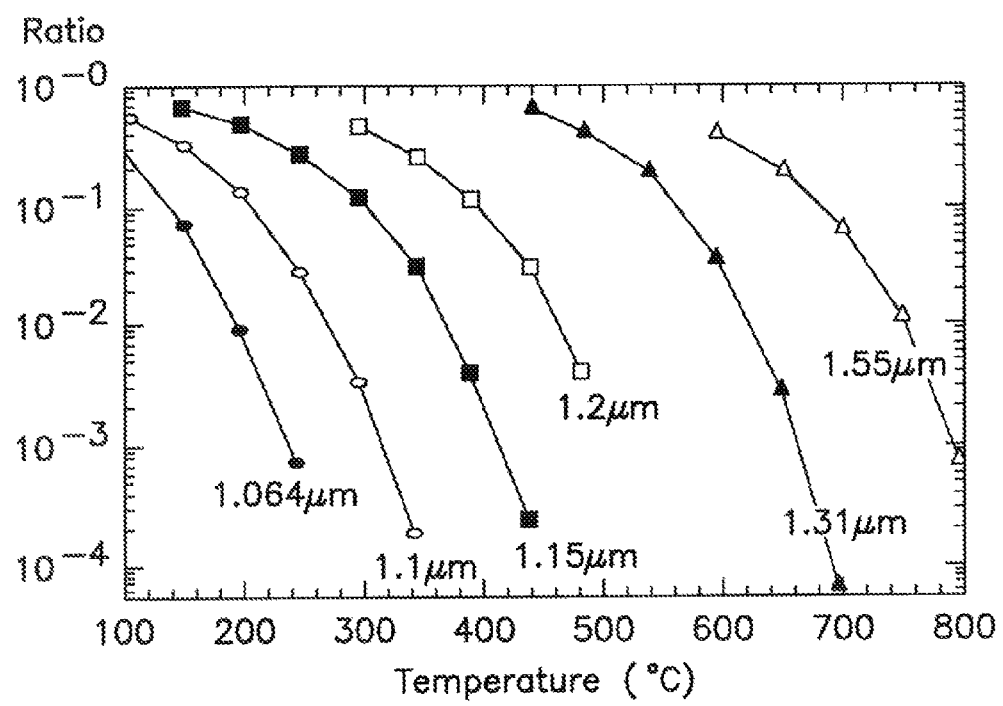
FIG. 2 is a graph illustrating the amount of light that is transmitted through a silicon wafer at different temperatures and wavelengths.

From the ratio of transmission of a wafer at a relatively high temperature in relation to transmission where absorption is negligible (see above equations) such as at low temperatures or when no wafer is present in the system, the temperature of the wafer can be calculated at the higher temperatures. For instance, FIG. 2 is a graph showing the transmission ratio measured for a silicon wafer having a diameter of 200 mm and a thickness of about 725 microns at various wavelengths. As shown, the wavelengths vary from 1.064 microns to 1.55 microns. As also shown, the transmission at the longer wavelengths of light can be used to determine higher temperatures.

At the included wavelengths of light, however, temperature readings above about 850° C. become difficult because the transmitted light signal becomes small and is difficult to detect. In order to take temperature readings even at higher temperatures, a calibration wafer can be used that is thinner than the 725 micron wafer used to generate the results in FIG. 2. The use of thinner wafers to determine temperatures above 850° C. will be discussed in more detail below.

When calibrating the temperature measurement device 27 as shown in FIG. 3, it is desirable for the calibrating light source 23 and the light detector 42 to take readings as close as possible to the location on the wafer where the temperature is measured by the temperature measuring device 27. In other words, the calibration probe should be at a position either within the field-of-view of the pyrometer or near enough for there to be very small temperature differences between the temperature at the calibration probe and the temperature in the pyrometer's field-of-view. This can be quantified by referring to the thermal diffusion length, $L_d$, which is given by:

$$L_d = \sqrt{\frac{k_{Si} d_w}{4(\varepsilon_f + \varepsilon_b)\sigma T^3}}$$

where $k_{Si}$ is the thermal conductivity of silicon, $d_w$ is the wafer thickness, $\varepsilon_f$ and $\varepsilon_b$ are the total emissivities of the front and back surfaces respectively, $\sigma$ is the Stefan-Boltzmann constant and T is the wafer temperature.

For many applications, the calibration point should be within $\sim L_d$ of the field-of-view of the pyrometer. As the temperature increases, this distance decreases. For example, at high temperatures such as greater than 1100° C., this distance can be as small as approximately 4 mm. Regardless, for many applications, the distance between the calibration point and the pyrometer field-of-view should not exceed about 3 $L_d$. For instance, in most applications, the distance between the location on the wafer where the temperature is measured by the temperature measuring device and the location on the wafer where the light detector detects the transmitted light should be no greater than about 5 cm.

Figure 4:
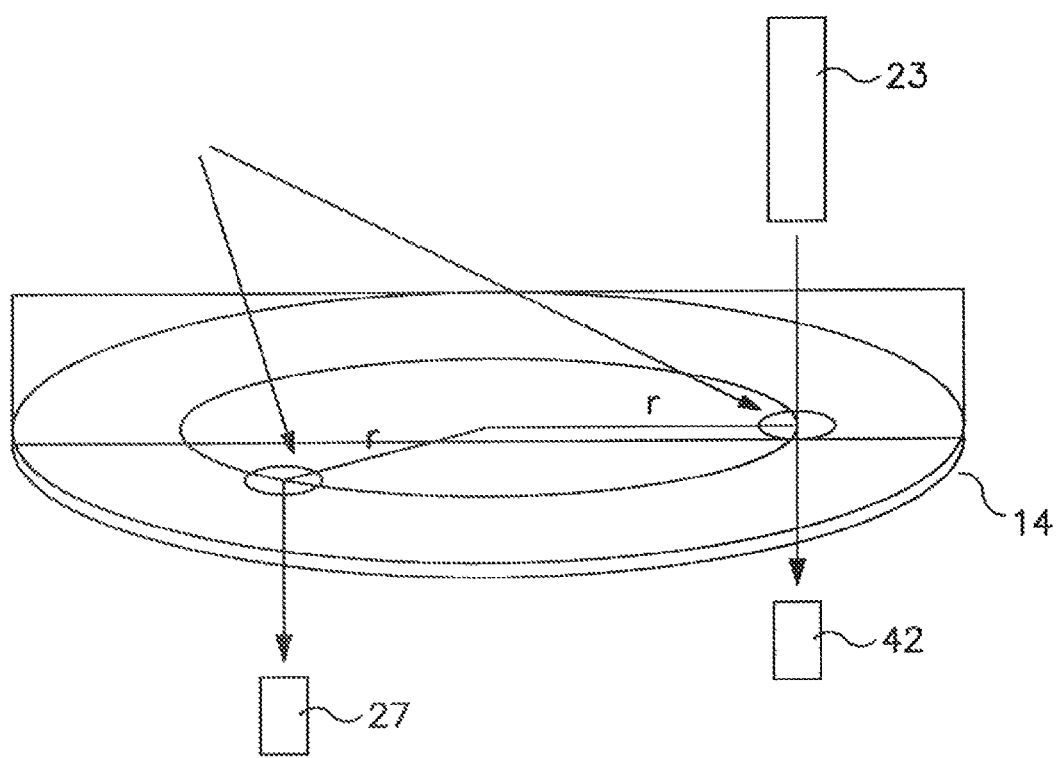
FIG. 4 is a perspective view of an alternative embodiment of a system made in accordance with the present invention.

When the wafer is being rotated in the thermal processing chamber, however, accuracy can be maintained by detecting the transmitted light on the same or near the same radius of the wafer as where the temperature measurement device 27 measures the wafer temperature as illustrated in FIG. 4.

Referring to FIG. 1, one embodiment of a thermal processing system generally 10 incorporating a system for calibrating temperature sensing devices in accordance with the present invention is illustrated.

System 10 includes a processing chamber 12 adapted to receive substrates such as semiconductor wafers for conducting various processes. Chamber 12 is designed to heat the wafers at very rapid rates and under carefully controlled conditions. Chamber 12 can be made from various materials, including certain metals, glasses and ceramics. For instance, chamber 12 can be made from stainless steel or quartz.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with the wafers. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, chamber 12, in one embodiment, can include a substrate holder 15 designed to rotate wafers using a wafer rotation mechanism 21 as shown by the arrow located above the wafer 14. Rotating the wafer promotes greater temperature uniformity over the surface of the wafer and promotes enhanced contact between the wafer and any gases introduced into the chamber. It should be understood, however, that besides wafers, chamber 12 is also adapted to process optical parts, films, fibers, ribbons, and other substrates having any particular shape.

A heat source generally 22 is included in communication with chamber 12 for heating the wafers during processing. In this embodiment, heat source 22 includes a plurality of lamps or light sources 24, such as tungsten-halogen lamps. Heat source 22 can include a reflector or set of reflectors, for carefully directing thermal energy being emitted by the heat source onto the wafers so as to produce a very uniform wafer temperature. As shown in FIG. 1, lamps 24 are placed above the chamber. It should be understood, however, that lamps 24 may be placed at any particular location, such as below the wafer either alone or in combination with lamps 24.

The use of lamps 24 as heat source 22 can offer various advantages. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the thermal energy being emitted by the lamps.

Besides using lamps 24 or in addition to using lamps 24 as the heat source 22, the system 10 can include a heated susceptor 26 for heating the wafer 14. The susceptor 26, can be, for instance, an electrical resistance heater or an induction heater. In the system illustrated in FIG. 1, the susceptor 26 is placed below the wafer 14. Similar to the heating lamps, however, the susceptor 26 can be placed below the wafer, can be placed above the wafer, or the system can include multiple susceptors that are place above and below the wafer.

Also contained within chamber 12 is a plurality of radiation sensing devices generally 27. Radiation sensing devices 27 include optical fibers or light pipes 28 which are, in turn, in communication with a plurality of corresponding light detectors 30. Optical fibers 28 are configured to receive thermal energy being emitted by a wafer present in the chamber at a particular wavelength. The amount of sensed radiation is then communicated to light detectors 30 which generate a usable voltage signal for determining the temperature of the wafer. In one embodiment, each optical fiber 28 in combination with a light detector 30 comprises a pyrometer.

As shown, system 10, includes a window 32 which separates the lamps 24 from the chamber 12. In the embodiment illustrated, window 32 serves to isolate lamps 24 from the wafers and prevent contamination of the chamber.

As shown in FIG. 1, in accordance with the present invention, system 10 further includes calibrating light source 23 and a light detector 42 in order to calibrate radiation sensing devices 27. As described above, calibrating light source 23 emits light energy, particularly infra-red light energy onto the wafer at a particular location. The light emitted from the calibrating light source 23 that transmits through the wafer is detected by the light detector 42. From this information, the temperature of the wafer can be determined in order to calibrate the radiation sensing devices.

As shown in FIG. 1, the calibrating light source 23 can be positioned among the heating lamps 24 directly opposite the wafer 14. Alternatively, however, the calibrating light source 23 can be positioned outside of the chamber or in an alternative location. In this embodiment, light emitted from the calibrating light source can be delivered to the wafer 14 using fiberoptics.

In order to accurately measure the amount of light energy being transmitted through the wafer, the light detector 42 can include a light channel 44 that directs the transmitted light to the light detector as shown in FIG. 1.

Calibrating light source 23 used in the system of the present invention can generally be any device that is capable of emitting light energy at a desired wavelength. For instance, calibrating light source 23 can be an incoherent light source or a coherent light source. Examples of incoherent light sources include tungsten-halogen lamps, arc lamps, light emitting diodes, super-luminescent light emitting diodes, etc. Coherent light sources, on the other hand, include a solid state device such as a laser diode, a super fluorescent fiber laser, other types of lasers, etc.

When it is necessary to calibrate the radiation sensing devices, a calibration wafer 14 is placed in the chamber and the above procedure is carried out. In FIG. 1, only a single calibrating light source 23 and light detector 42 are shown. It should be understood, however, that for most applications, the system will include multiple light detectors and corresponding calibrating light sources for calibrating the various radiation sensing devices.

Referring to FIG. 1, system 10 further includes a system controller 50 which can be, for instance, a microprocessor. Controller 50 receives voltage signals from light detectors 30 that represent the radiation amounts being sampled at the various locations. Based on the signals received, controller 50 is configured to calculate the temperature of wafers contained in the chamber.

System controller 50 as shown in FIG. 1 can also be in communication with lamp power controller 25. In this arrangement, controller 50 can calculate the temperature of a wafer, and, based on the calculated information, control the amount of thermal energy being emitted by lamps 24. In this manner, instantaneous adjustments can be made regarding the conditions within reactor 12 for processing the wafer within carefully controlled limits. As described above, in addition to the lamps 24 or as an alternative to the lamps 24, the system can further include a susceptor 26 as shown in FIG. 1. In this embodiment, the controller 50 can also be used to control the amount of heat being emitted by the susceptor. When both heating devices are present, the susceptor can be controlled independently of the lamps or in conjunction with the lamps. (Or the system might not contain lamps, only a susceptor)

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

In accordance with the present invention, system controller 50 can also be used to automatically calibrate radiation sensing devices 27. For instance, controller 50 can also be in communication with calibrating light source 23 and light detection 42. In this manner, controller 50 can be used to control when calibrating light source 23 emits light and the amount of light that is emitted. Controller 50 can also be configured to receive information from the light detector 42 for determining the temperature of a calibration wafer and thereafter calibrating the radiation sensing devices 27 based upon the determined temperature.

Various embodiments of the present invention will now be discussed. In particular, first operation of the present invention using an incoherent light source will be described followed by a discussion of using a coherent light source. Subsequently, various embodiments of a calibration wafer will be described. Finally, methods for carrying out the present invention will be discussed.

Calibrating Light Source

A. Incoherent Light Source

As stated, in one embodiment, the calibrating light source 23 can be an incoherent lamp, such as a tungsten-halogen lamp or a light emitting diode. For example, in one embodiment, the calibrating light source can be a super-luminescent light emitting diode. Some incoherent light sources have the advantage that they can be used as a light source for transmission measurements at several wavelengths as desired. For example, some incoherent light sources emit a wide range of wavelengths, while others, such as a light emitting diode, emit relatively narrow ranges of wavelengths. When using an incoherent lamp, the light detector 42 can include a single detector for detecting a single wavelength or can include a detector array that measures the transmitted signal at several wavelengths simultaneously.

Besides including a single calibrating light source 23 as shown in FIG. 1, it should also be understood that multiple calibration light sources can be present in the system of the present invention. Alternatively, a single calibrating light source can be used that is placed in communication with multiple optic fibers for transmitting light onto the wafer 14 at multiple positions.

In one embodiment, the output of the calibrating light source can be chopped, for example, by a mechanical chopper or can be chopped electronically. Emitting the light from the calibrating light source onto the wafer at intervals can assist in determining the amount of background stray light that is present by making a measurement when the calibrating light source is emitting light and when the calibrating source is not emitting light.

Figure 5:
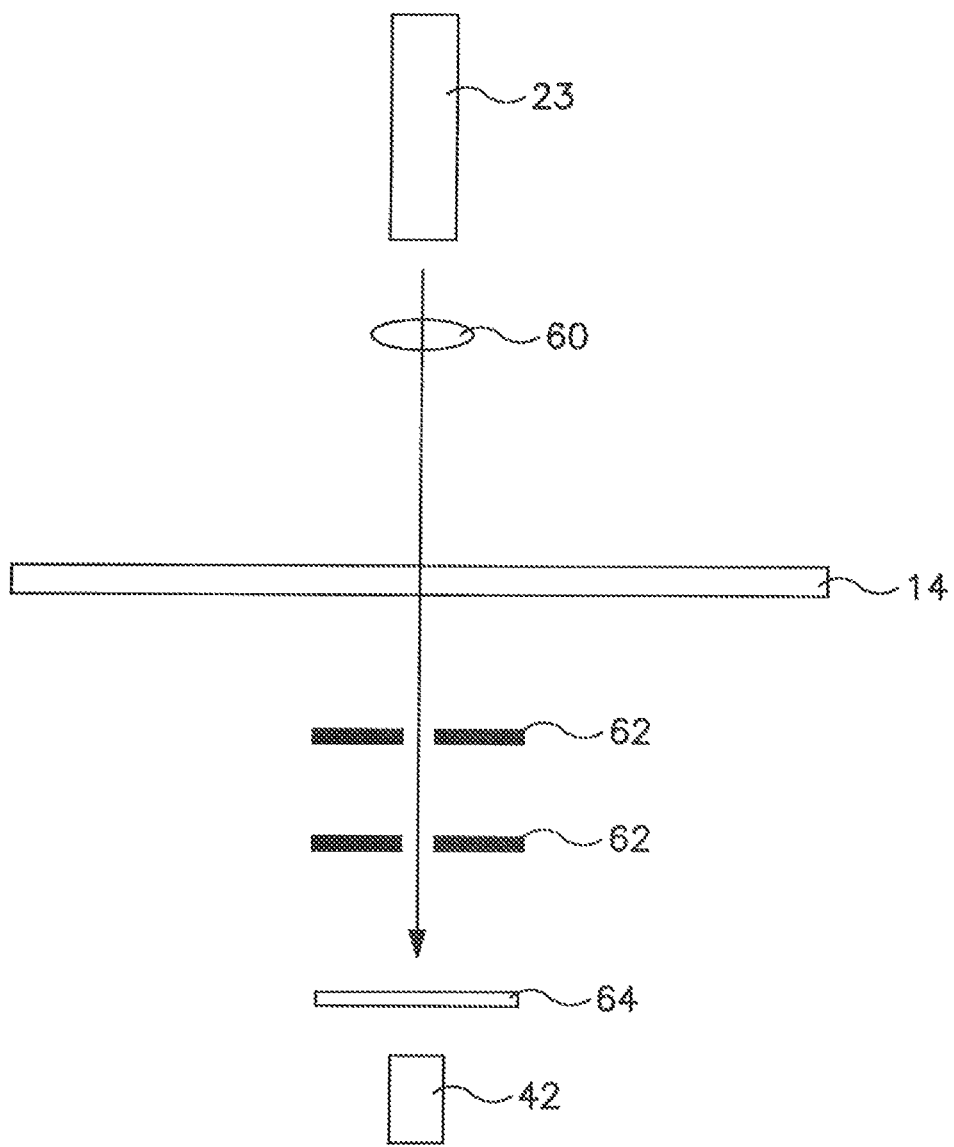
FIG. 5 is another alternative embodiment of a system made in accordance with the present invention.

One embodiment of a system made according to the present invention using an incoherent light source as the calibrating light source 23 is shown in FIG. 5. In this embodiment, the light source 23 transmits a beam of light through a calibrating wafer 14, which is detected by a light detector 42. The light detector 42 can be, for instance, a photodetector or any other suitable device.

In this embodiment, the lamp 23 is used in conjunction with collimating optics 60 for focusing the light onto a particular location of the wafer 14. In order to measure the light being transmitted through the wafer 14 and in order to eliminate stray light, the system can include one or more apertures 62 that define the field of view for the light detector 42. A spectral filter 64 can also be included in order to better define the wavelength band that is to be detected.

Although the embodiment shown in FIG. 5 has been described in relation to the use of an incoherent light source, it should be understood that the use of collimating optics and generally the configuration illustrated in FIG. 5 can be used with all different types of light sources, whether the light sources are coherent or incoherent.

B. Coherent Light Sources

As an alternative to using an incoherent light source, the calibrating light source can also be a coherent light source, such as a laser which can provide relatively high power in a narrow wavelength range. One particular example of a coherent light source is a semiconductor laser. Such light sources are easily modulated electrically. Coherent light sources, such as lasers, have a very narrow emission spectrum. Although this can provide some advantages, having a narrow emission spectrum can also pose potential problems. In particular, the system may be more sensitive to interference effects when light being emitted by the coherent light source is reflected between the two surfaces of the wafer. In particular, the transmitted signal that ultimately reaches the light detector 42 may be more sensitive to the wafer thickness and its refractive index than when using an incoherent light source. Several measures, however, can be taken to counteract this effect.

For instance, in one embodiment, a coherent light source can be used that has a multiple wavelength emission spectrum or a collection of narrow emission spectrums. In another embodiment, the calibrating wafer can include at least one rough surface, although this may have the undesirable effect of scattering some of the light from the light source. In still another embodiment of the present invention, the path length of the light being emitted by the calibrating light source can be changed, for instance, by making small changes in the wafer thickness. Specifically, the thickness of the wafer can be varied such as by gradually decreasing in the areas where the transmission measurements are to occur. In another embodiment, the calibration wafer can include anti-reflective coatings as will be described in more detail below.

When the wafer is rotated during heating, it is possible to exploit the rotation in order to decrease the effect of interference within the wafer. One approach is to rotate the wafer and measure the transmitted light signal. As the wafer rotates, the thickness of the wafer probed by the infra-red beam will alter slightly and the condition for interference will change, causing oscillations in the transmitted light intensity. By collecting the signal over at least one rotation, the effect of interference can be averaged out to obtain a more reliable value for the transmission.

Another approach involves placing an optical element (such as a ground glass plate) in the path of the coherent light source such that the light beam loses its spatial coherence. By altering the phase of the electromagnetic field oscillations across the profile of the beam and then collecting a section of the beam at the detector in such a manner that the various components are combined in the measured signal, the effect of interference within the wafer or optical elements can be greatly reduced. The use of multiple laser sources that are placed close together so that they can be combined to form one optical beam would also achieve similar results. Large area emitting sources that incorporate multiple laser elements could be useful in this embodiment.

In still another embodiment, the use of multiple coherent light sources could help reduce the temporal coherence of the beam by introducing a range of wavelengths. For instance, some types of diode lasers do not have a tightly controlled emission wavelength. The natural scatter in device characteristics may result in a broader effective spectrum for illumination. If desired, light devices could deliberately be selected to provide a greater range of wavelengths. Also, some light sources with the same nominal specification could be deliberately run at different temperatures to create a range of wavelengths, since in many cases the output wavelength is sensitive to the device temperature.

In another embodiment, interference effects may be reduced by using the combination of an incoherent light source and a coherent light source. In this embodiment, the incoherent light source can be used as the calibrating light source at lower temperatures. At lower temperatures, transmission measurements are not as dependent upon various parameters such as the refractive index and the thickness of the substrate. Relatively lower temperatures can include temperatures less than about 700° C., and particularly less than about 500° C.

At relatively high temperatures, such as greater than about 500° C., and particularly greater than about 700° C., the calibrating light source can be a coherent light source. At higher temperatures, coherent light sources may be preferred because they provide greater power at a particular wave length and better wavelength definition. The same or different detectors can be used to detect transmission from the calibrating light sources. In this embodiment, for instance, transmission measurements can be taken at lower temperatures using an incoherent light source. These transmission measurements can then be used to determine the temperature of the wafer at higher temperatures in conjunction with transmission measurements taken using the coherent light source.

Regardless of whether a coherent or incoherent light source is used, it is desirable that the power supply to the light source be configured in order to provide a stable and repeatable intensity for most applications. Although the technique of the present invention is self-calibrating, in a sense that the transmission measurements when the wafer is hot are made relative to a transmission value obtained when the wafer is at temperature where its transmission is known, there is still a possibility of some drift in the light source intensity while the wafer is heated through the calibration recipe. This variation can be reduced by ensuring that the power supply to the light source is stable. Optionally, an optical detector can be used to sample some of the light emitted from the calibrating light source and hence generating a signal for either monitoring the light source or controlling its intensity so that it is stable and repeatable during the measurements.

Calibration Wavelength

The operating wavelength for the transmission measurement should be selected in order to provide good sensitivity to temperature. In general, the wafer should be sufficiently transparent to allow an accurate measurement of the transmitted infra-red signal intensity. In most situations, this requires the transmissivity at the probe wavelength to be greater than $10^{-6}$.

The wafer transmission should also be sensitive to the wafer temperature. For example, it is desirable that, near the specified calibration temperature, the wafer transmission changes by greater than about 0.5% of its value for a 1° C. change. Ideally, the transmission changes by about greater than 5% for a 1° C. temperature change.

In some applications, it can be advantageous for the calibration wafer to be close to opaque at the pyrometer wavelength while it still transmits a measurable amount of radiation at the transmission test wavelength. This may be desirable so that the calibration reflects a typical condition for the optical properties of a standard thickness wafer at the calibration temperature of interest. In practice, it would be sufficient for the wafer to have a transmissivity of less than about 0.01 at the pyrometer wavelength, while the transmissivity at the infra-red transmission probe wavelength is greater than about $10^{-6}$. This condition can often be met because the absorption coefficient of silicon typically exhibits a minimum value in the near infra-red range, so that the transmission measurement can be performed in this wavelength range, under conditions where the wafer is opaque at other wavelengths. This concept may be especially useful for calibration at temperatures greater than about 800° C., where standard thickness wafers usually are highly opaque at optical and infrared wavelengths.

In other applications, it may be desirable to know the wavelength of the measurement to an accuracy better than that of the nominal value given for an emitting source or optical filter. In this case, the spectrum of the emitting source or the transmission of the optical filters can be measured so that the exact measurement wavelength is established. This value can then be used to improve the accuracy or repeatability of readings. For example, if the measurement system is used in multiple processing systems, it may be important to correct for the effect of variations in the measurement wavelengths between systems, in order to achieve the most consistent calibrations on different systems. One way to do this is to use an algorithm that takes account of the wavelength input and wavelength variations when converting a transmitted light signal into a deduced temperature.

In one embodiment, as stated above, the system of the present invention can be configured so that temperature measurements are performed over a range of wavelengths instead of a single wavelength. Measuring the temperature over several wavelengths can provide various advantages. For instance, a measurement of a transmission spectrum allows the wafer temperature to be determined without having to perform the normalization step of measuring the transmitted intensity at a temperature where the wafer transmission is known, such as when the wafer is cool. It is possible to determine the temperature because the shape of the absorption spectrum can be identified and used to determine the wafer temperature. In this manner, it is not necessary to take a temperature reading where the transmission of the wafer is not a strong function of temperature.

More particularly, by measuring the transmission for at least two wavelengths, a relative transmission at those wavelengths can be defined. The broader spectrum (i.e., multi-wavelength) can be collected and matched to a model, using temperature as a parameter for the fit. In this embodiment, there may be advantages and better resilience against fluctuations in wafer thickness or unexpected variations in other parameters such as coatings, etc.

These circumstances can also be useful if trying to calibrate a pyrometer for operation at very low temperature, such as less than about 200° C. In these circumstances, the normalization temperature typically has to be very close to room temperature, to prevent the transmission from being sensitive to the exact value of the normalization temperature. This is especially helpful in applications where the thermal processing environment is already warm when the wafer is added, thus making it very difficult to take a temperature reading below about 30° C.

Spectral measurements taken over a range of wavelengths also tend to make the temperature measurement less sensitive to drift in the light source intensity or detector characteristics, optical contamination and noise. Spectral measurements can be taken using an incoherent light source that emits light at different wavelengths or can be done by using multiple light sources, such as multiple incoherent sources or multiple coherent sources. The measurement can be taken at different wavelengths at the same time or at different times, such as consecutively.

As shown in FIG. 1, the calibrating light source 23 is positioned directly above the light detector 42. The light that is emitted from the calibrating light source 23 can be configured to shine directly onto the wafer or, alternatively, can be incident on the wafer at a non-normal angle of incidence.

In some applications, it may be desirable for the light to contact the wafer at an angle in order to reduce reflection from the wafer surface. For example, if the light is in the P-polarization plane and is incident at an angle near the critical angle, then the reflectivity of the surface approaches zero. By reducing reflectivity, not only is a stronger signal transmitted through the wafer, but interference effects within the wafer are reduced. In one embodiment, it may be desirable to use polarized light at a non-normal angle of incidence.

Reducing the Effects of Stray Radiation

As described above, in order to improve accuracy, the measurement and system of the present invention should have the ability to distinguish between the transmitted light signal and signals that may arise from stray radiation sources. In the embodiment illustrated in FIG. 1, the wafer 14 is only heated from one side. In this case, the wafer itself acts as a screen to decrease the possibility of stray light reaching the light detector 42, since the detector is located on a side of the wafer opposite the light sources 24. There are various other manners available, however, to decrease stray light and interference especially for use in systems that contain light sources on both sides of the wafer.

In general, for most applications, the calibrating light source 23 should be modulated so that the light signal received by the light detector 42 is an ac signal or other similar signal, that can be distinguished from signals that arise from stray light originating from the wafer, the lamps or other radiation sources. The transmitted light signal can be extracted from the detected signal in order to remove stray light by a variety of techniques including spectral filtering, signal averaging and phase-sensitive detection, for example, with a lock-in amplifier. The above approaches can extract a very small ac signal even in cases where the signals are contaminated with large amounts of noise.

In one embodiment, the illumination optics can also be configured to maximize the amount of transmitted light that reaches the light detector 42. For instance, as shown in FIG. 5, the beam of light emitted by the calibrating light source 23 can be collimated. Another approach involves using a light source having a filament temperature which is significantly hotter than the wafer, such as by using a tungsten filament, so that the light source is much brighter than the wafer at the wavelength being monitored. Coherent light sources can also be used for this purpose. The use of laser sources may also permit the delivery of significantly higher optical powers through the wafer and into the light detector 42.

Besides using illumination optics to strengthen the transmission, detection optics can also be configured to minimize stray light. For instance, detection optics can be used that only view the region of the wafer that is illuminated. The detection optics can have angular acceptance characteristics that favor collection of light that emanates from the light source, rather than the wafer. For example, the black-body radiation emitted by the wafer tends to radiate in all directions from the wafer surfaces. By restricting the angular acceptance characteristics of detection optics so that they tend to accept light traveling in the direction defined by the light source optics, the ratio of emitted radiation to transmitted light can be decreased. Similar considerations can be applied to the radiation of stray light from the heating lamps 24. Heating lamps 24 can create radiation that is transmitted through the wafer or reflected from the backside of the wafer depending upon where the lamps are located. If the system includes detection optics that do not accept direct light paths from the lamps through the wafer or light paths corresponding to the condition for specular reflection of light off the wafer, then the stray light from the lamps can be greatly reduced.

Besides illumination optics and detection optics, the system of the present invention can also include an optical filter that rejects radiation from outside a range of wavelengths around the wavelength being used for the transmission measurement. For instance, this wavelength range can be defined by an interference filter.

Especially when using an incoherent light source as the calibrating light source 23, such as a tungsten-halogen lamp, it is desirable for the filter to have good blocking characteristics outside the desired pass band. Specifically, the incoherent light source may emit light that is modulated at all wavelengths, and as a result the light detector 42 can receive an AC signal that arose from modulation at wavelengths other than the filter pass band. For instance, in most applications, the filter transmission should be below about $10^{-3}$ outside the pass band, and when the measurements are performed using wavelengths less than about 1.4 microns, desirably the filter has the above blocking characteristics, especially on the long-wavelength side of the pass band, because the silicon transmission is higher at longer wavelengths.

In one embodiment, the filter blocking can be below about $10^{-6}$. This type of blocking can be achieved by combining two interference filters in such a manner that their combined blocking reaches the desired value. In some cases, it may be convenient to put one of the filters on the output of the lamp source to restrict the wavelength range that is emitted from the lamp.

If the calibrating light source 23, however, is a coherent light source such as a laser, filters are not needed, because the range of modulated wavelengths is inherently small. Nevertheless, in one embodiment, a filter can be used to decrease the amount of stray radiation from the wafer and the heating lamps.

Even when using an incoherent light source, a filter may not be desired. Alternatively, a multiple band filter can be used. Operating without a narrow band filter or with a multiple band filter can provide various advantages in some circumstances. For instance, when operating without a filter, one detector can be used to detect radiation from several different light sources emitting radiation at different wavelengths, without the need for switching filters.

In still another embodiment of the present invention, the calibrating light source 23 can emit polarized light. In this embodiment, the system can include detection optics that select a specified polarization, for removing stray light. In order to produce polarized light, the calibrating light source 23 can be a laser that is inherently polarized. Alternatively, the calibrating light source 23 can include a polarizer.

Calibration Wafer

The calibration wafer used in the system of the present invention is selected so that light transmission through the wafer is a function of temperature at the wavelength observed by the light detector 42. The wafer can be optimized for the purposes of calibration in any number of ways including varying the thickness, doping the wafer, applying surface coatings to the wafer, and modifying the surface texture.

In one embodiment, the calibration wafer can be a plain silicon wafer. The wafer can be a lightly-doped silicon wafer with a resistivity greater than about 0.5 Ωcm. In this embodiment, standard thickness wafers can be used. Currently, standard wafer thicknesses are 725 microns for a 200 mm wafer and 775 microns for a 300 mm wafer. For most applications, the wafer is polished on both sides in order to improve the repeatability of the calibration standard.

The calculation of the temperature of the calibration wafer depends upon the wavelength of light being transmitted through the wafer and the thickness of the wafer. In this regard, the thickness of the wafer should be known with some accuracy. In one embodiment, it may be desirable to correct for variations in the wafer thicknesses that are used during temperature measurements. For example, the wafer thickness can be measured and this data can be entered into the algorithm used to determine the wafer temperature. Alternatively, the system of the present invention can be equipped with an instrument that measures the wafer thickness and automatically provides this information to, for instance, the controller 50 for use during temperature measurements. The wafer thickness instrument can measure the thickness of the wafer inside the thermal processing chamber or can measure the thickness of the wafer prior to inserting the wafer into the chamber. Such an instrument, however, is not necessary if the calibration wafer is made so that thickness variations are negligible.

In order to inhibit reflection from the wafer of light emitted from the calibrating light source 23, in one embodiment, the calibration wafer 14 can be coated with an anti-reflection coating. Coating the wafer with an anti-reflection coating not only reduces the amount of light that is reflected from the wafer but also reduces the effect of interference that occurs inside the wafer.

Figure 6:
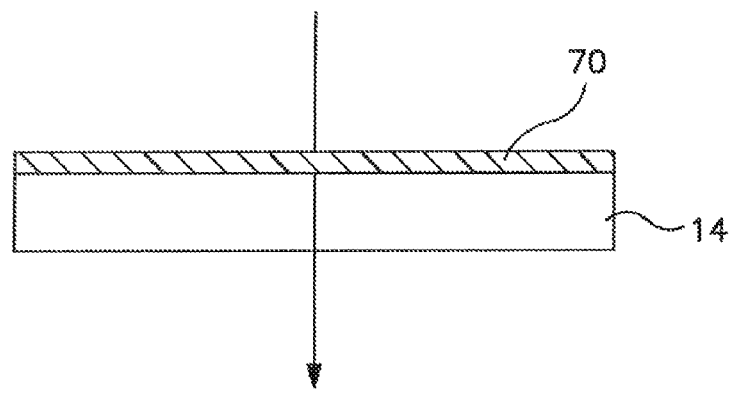
FIGS. 6 through 21 are different embodiments of calibration wafers made in accordance with the present invention.
Figure 7:
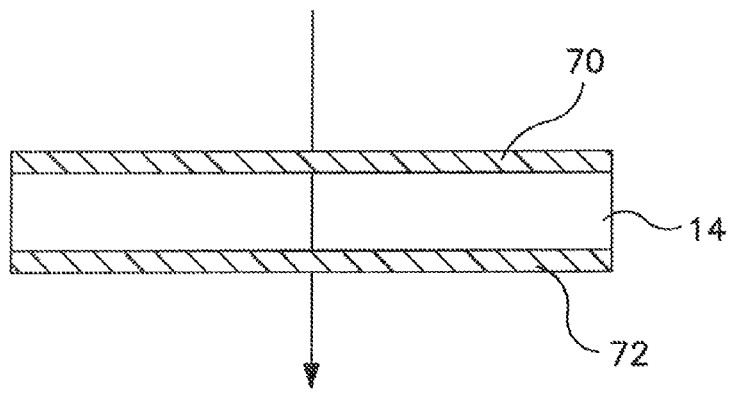

Referring to FIGS. 6 and 7, two embodiments of a calibration wafer 14 containing anti-reflective coatings are shown. In FIG. 6, a single anti-reflective coating 70 is present on the top surface of the calibration wafer 14. In FIG. 7, on the other hand, an anti-reflective coating 70 is placed on the top of the wafer 14, while a second anti-reflective coating 72 is placed on the bottom of the wafer.

When anti-reflective coatings are applied to the wafer, reflection of light at the infra-red wavelength of interest can be significantly reduced and interference effects are suppressed. The anti-reflective coating(s) also provides a benefit in that it increases the amount of light transmitted by the wafer, improving the accuracy of the transmission measurements.

Anti-reflective coatings, however, may affect the emissivity of the wafer at the pyrometer wavelength of the pyrometer that is being calibrated. For calibrations that are performed at high temperatures, where the wafer is usually opaque at the pyrometer wavelength, it may be desirable to only coat one surface of the wafer as shown in FIG. 6. Specifically, the surface of the wafer facing the pyrometer can remain uncoated so that the desired effect is achieved without influencing the emissivity of the pyrometer wavelength.

Figure 8:
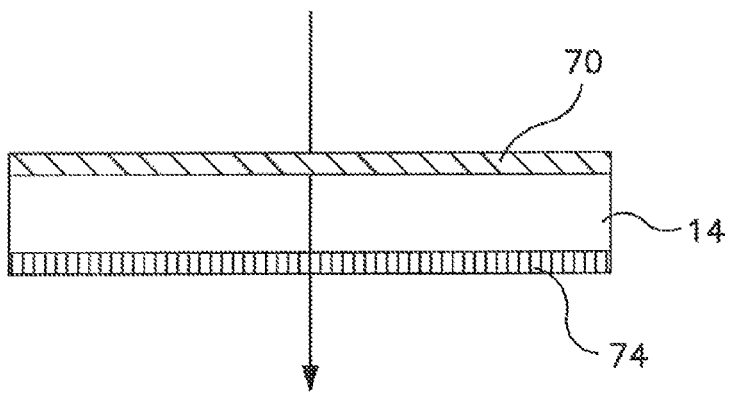

In another embodiment of the present invention, as shown in FIG. 8, the calibration wafer 14 can include not only an anti-reflective coating 70 but a coating 74 having a specified emissivity. In particular, in many situations the temperature measurement device contained within the thermal processing chamber is calibrated with a set of wafers that have different spectral emissivities at the pyrometer wavelength. Wafers having different emissivities are used in order to correct for emissivity effects in pyrometry and make the temperature measurements independent of the spectral emissity of the target wafer. Consequently, in some embodiments, different calibration wafers can be used according to the present invention having particular emissivities.

In general, any suitable anti-reflective coating can be used according to the present invention. Such coatings can be made from, for instance, silicon dioxide, silicon nitride or a combination of the two. Such materials can also be used to form coatings having a particular emissivity. Silicon films can also be used for this purpose. Silicon films have a large refractive index which may be useful in some applications. The coatings 70 or 74 as shown in FIG. 8 can also be made from a dielectric film. The dielectric film can be a multi-layered film specially designed to have the appropriate reflectivity and/or emissivity at the desired wavelength. Such films are known in the art and can be obtained from Deposition Sciences, Inc. of Santa Rosa, Calif.

When present, the coating 70 or 74 can affect the transmission of the infra-red light being emitted by the calibrating light source 23. These variations can be taken into account, either through calculations or measurements, and incorporated into the algorithm that is used to calculate the temperature of the calibration wafer. It is also possible to form different coating designs that act as anti-reflective coatings at the infra-red transmission wavelengths, and act as reflective or anti-reflective coatings at the pyrometer wavelength.

Besides possibly improving the accuracy of temperature measurements made according to the present invention, the use of anti-reflective coatings and other types of coatings may provide other benefits. For instance, by choosing the optical properties of the coatings on the calibration wafer, it is possible to probe various aspects of the temperature measurement system's performance, and provide diagnostics of the nature of problems. For example, a test which checks whether the pyrometer optics and electronics are operating correctly can use a wafer backside coating which is "black" at the pyrometer wavelengths, so that the signal at the pyrometer is not affected by other aspects of the system optics, such as affects arising from multiple reflections between the wafer and the chamber walls. This is especially useful if the system uses reflective enhancement of the wafer emissivity to assist with emissivity-independence. In these systems, the reflectivity of the auxiliary reflector used for emissivity enhancement plays a key role in the system performance. A test which can reveal if the reflective plate reflectivity has degraded, uses a coating which is highly reflective at the pyrometer wavelength, so that multiple reflections from the reflective plate become involved. This kind of wafer can also be useful for checking that emissivity correction systems are working in any kind of system. These type of tests can distinguish various types of problems without requiring the chamber to be opened for inspection.

Coatings as described above can also help reduce the effect of progressive thermal degradation on the wafer's optical properties because of oxidation and surface roughening. Consequently, multiple thermal cycles can be applied to the calibration wafer without degradation. For example, a thin layer of oxide, such as less than about 30 nanometers thick, can protect the silicon surface from thermal etching that results from active oxidation by low concentrations of oxygen and water vapor in the ambient gas. A thin film of nitride can serve a similar purpose. The films can be included as the top layers in the coating stacks used for anti-reflective coatings or for altering the spectral emissivity as described above. Further, by choosing films of oxide that are less than about 30 nanometers thick, the impact on the emissivity of the wafer by the film can be minimized.

Besides using silicon wafers as the calibration wafers, it should also be understood that various other types of wafers can be used. In general, the calibration wafer can be made from any suitable material that has a temperature dependent transmission or reflection spectrum. For instance, the calibration wafer can also be made from germanium, silicon carbide, gallium arsenide, aluminum arsenide, indium phosphide, gallium phosphide, gallium nitride and their alloys. In fact, some of the above materials may be useful to extend the temperature range for transmission.

When using silicon as the calibration wafer, silicon is known to have good temperature transmission properties at temperatures less than about 850° C. for standard thickness wafers. As described above, however, at temperatures greater than 850° C., silicon begins to absorb more light energy making temperature measurements more difficult. In one embodiment, in order to extend temperature measurements according to the present invention to higher temperatures, thinner wafers can be used. For example, the predicted internal transmission at a wavelength of 1.5 microns for a 250 micron wafer at 950° C. is 0.012, which is more than 300,000 times higher than the transmission for a wafer having a conventional thickness of 725 microns. By using very thin wafers, the IR transmission can be extended to higher temperatures. Further, using thin wafers will not have an impact on temperature measurements taken by the pyrometer, so long as the wafer remains opaque to radiation at the wavelength of the pyrometer.

Various practical problems, however, can arise when using relatively thin wafers. For instance, the wafers may sag under their own weight at high temperatures and may even undergo plastic deformation. FIGS. 9 through 18 are examples of various embodiments of calibration wafers having thin areas where these types of problems can be minimized.

Figure 9:
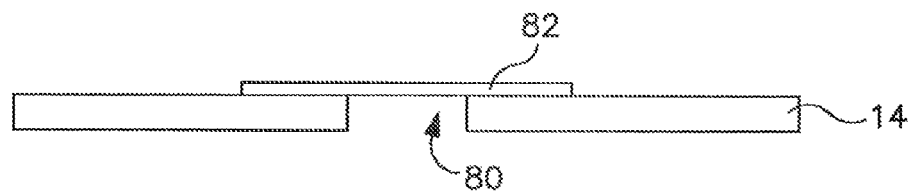

For example, referring to FIG. 9, a calibration wafer 14 is shown having a thin area for transmission measurements. In this embodiment, the wafer 14 includes a hole or passage 80 at a location that is in the field of view or near the field of view of the light detector 42 and the temperature measurement device or pyrometer 27 that is to be calibrated. In this embodiment, a silicon member 82 having the desired thickness is placed on top of the hole 80. The thickness of the silicon member 82 can be, for instance, less than about 300 microns, particularly less than about 200 microns, and more particularly less than about 150 microns. By placing the silicon member 82 over the hole 80 formed into the wafer 14, a calibration wafer can be created that is relatively strong for use in thermal processing chambers, but yet has a thin section for use in making measurements according to the present invention.

The silicon member 82 can be positioned in place over the hole 80 and secured to the wafer using various methods. For example, in one embodiment, the silicon member 82 can be bonded in position. Any suitable bonding method can be used such as anodic or thermal bonding.

In an alternative embodiment, a retaining cover can be placed over the wafer in order to hold the silicon member in place. The retaining member can be made from silicon, silicon carbide, silica (quartz) or sapphire. If the retaining cover is not transparent, it may be necessary in some applications to place a hole or passage through the retaining cover that is in alignment with the silicon member in order to take accurate transmission measurements. When using a transparent material, such as quartz or sapphire, however, then such an opening will not be needed.

Figure 13:
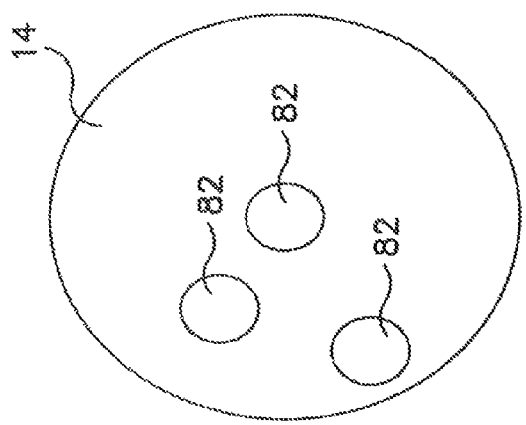

In one embodiment, the silicon member 82 can have different thicknesses to cover different temperature ranges. In this embodiment, the varying thickness range may allow the system to use fewer infra-red transmission wavelengths to calibrate a wider temperature range. Further, if multiple pyrometers are to be calibrated, the calibration wafer 14 can include many different holes at the various different locations as shown in FIG. 13. Alternatively, a set of different calibration wafers can be used that each contain a single or a few holes at selected locations.

Figure 10:
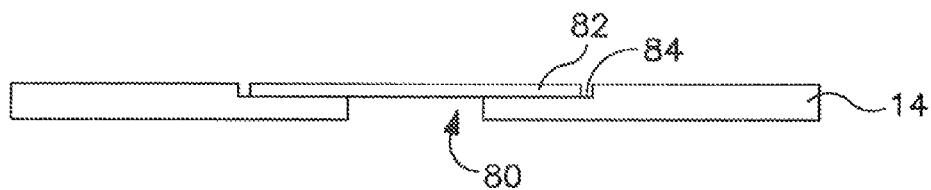

As shown in FIG. 10, in one embodiment, the calibration wafer 14 can include a recess 84 that contains a ledge for placement of the thin member 82. In this embodiment, the thin member 82 remains in alignment during processing and is easier to position on top of the wafer.

Figure 11:
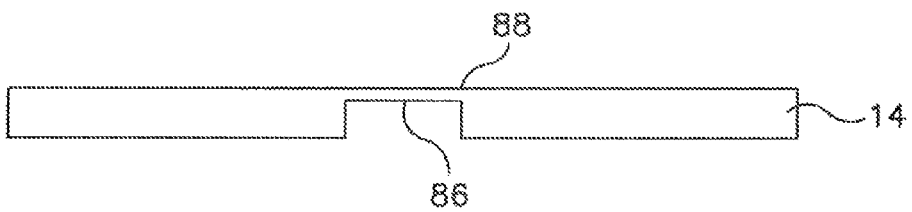
Figure 12:
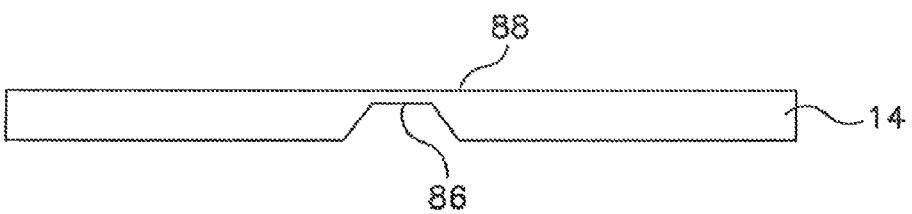
Figure 14:
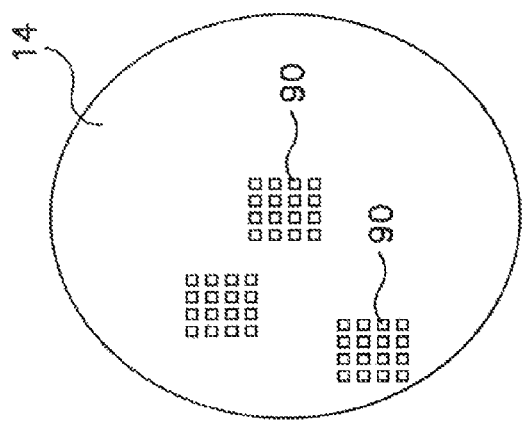

In another embodiment, instead of forming a hole in the calibration wafer 14 and then covering the hole with a thin member, a thin area on the wafer can be formed by forming a recess 86 in the wafer as shown in FIGS. 11 and 12. As shown, recess 86 forms a thin section 88 in the wafer 14. The recesses 86 can be formed by any suitable manner, such as by machining or etching. As shown in FIG. 14, in one embodiment, the recess 86 has a graded thickness forming a frustoconical shape. Further, the corners can be curved as well. The graded thickness and curved corners reduce thermal gradients at the edges of the thin section reducing the chance of mechanical failure and reducing stress.

When the calibration wafer includes thin sections, there is a possibility of temperature gradients developing in the wafer during heating. In order to reduce the effect of differences in thermal radiative properties between the thin section and the remainder of the wafer, the wafer can include a coating. The coating can be, for instance, a single layer or multi-layer coating. The coating can be made from materials such as silicon dioxide, silicon, polysilicon, and/or silicon nitride. The coating can be designed in order to better match the emissivity and absorptivity of the thin and thick sections. In one embodiment, the coating can be made from any of the anti-reflective coatings described above.

In an alternative embodiment, the calibration wafer can include a fill member that is placed adjacent to the thin section for reducing the thermal mass differences. The fill member can be made from, for instance, quartz or aluminum oxide, such as sapphire.

Figure 16:
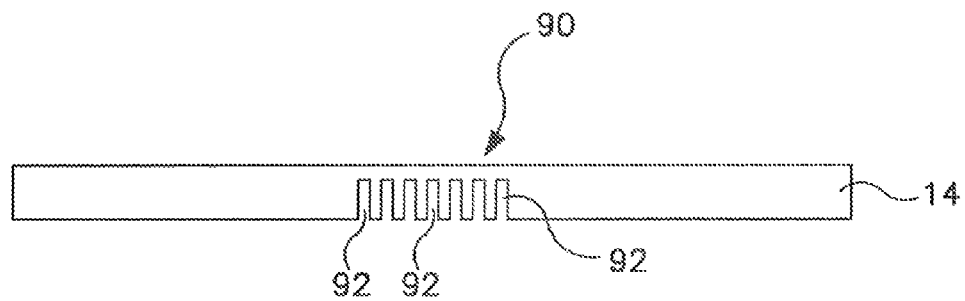
Figure 17:
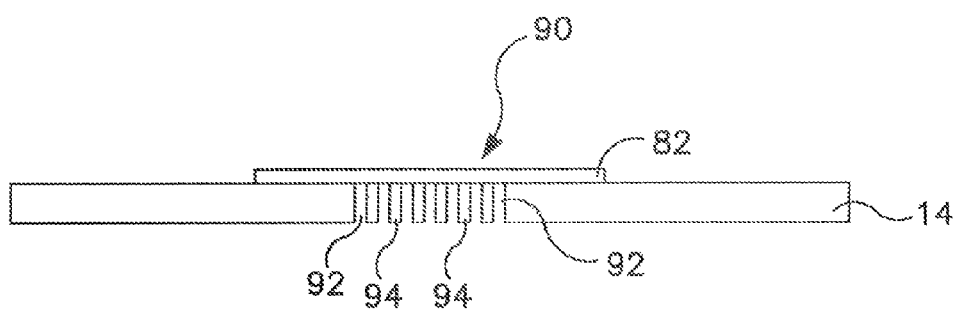
Figure 18:
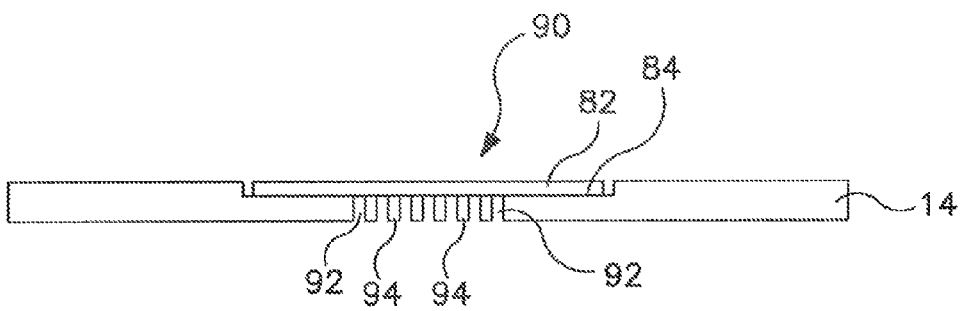

Further embodiments of a calibration wafer 14 made in accordance with the present invention are shown in FIGS. 16, 17 and 18. In these embodiments, the calibration wafer 14 includes a light transmission region 90 that is defined by a plurality of channels 92. Thus, the transmission regions 90 include thin regions mixed with thick regions, wherein the thick regions have the same thickness as the wafer itself. The channels 92 can only extend through a portion of the thickness of the wafer as shown in FIG. 16 or can pass through the entire thickness of the wafer as shown in FIGS. 17 and 18. In FIGS. 17 and 18, the thick areas 94 are attached to a thin member 82. Further, in FIG. 18, the thin member 82 is placed within a recess 84 formed into the wafer 14. In the embodiments illustrated in FIGS. 17 and 18, the thin member 82 can be attached, e.g. by bonding, to the wafer 14.

In the embodiments shown in FIGS. 16, 17 and 18, when the calibration wafer is heated to relatively high temperatures, light transmission is primarily determined by the channels 92. Therefore, the presence of the thick members 94 does not interfere with the temperature measurements. This embodiment of the calibration wafer provides several advantages. For instance, by keeping the thin region small and mixed with the thick regions, problems of lateral temperature gradients and thermal stresses can be reduced. Further, it may be easier to align a pyrometer, a calibrating light source, or a light detector with the transmission area 90.

When incorporating the embodiments illustrated in FIGS. 16 through 18, it may be desirable in some applications to know the ratio between the thick areas and the thin areas in order to correct for the presence of the thick areas during measurements. This ratio can be measured in any suitable manner. For instance, the ratio can be determined using physical measurements or optical measurements can compare the flux transmitted with the wafer in a beam path compared to that without the wafer present. The latter measurement can be performed at any convenient wavelength where the thick region is effectively opaque. The areas could also be established with high accuracy a priori, for example by forming them using optical lithography or other similar technique. The methods of micro machining could be employed to create suitable structures. Determining the thickness of the thin regions can be accomplished by, for instance, performing a transmission measurement at a known temperature at a suitable wavelength.

Figure 15:
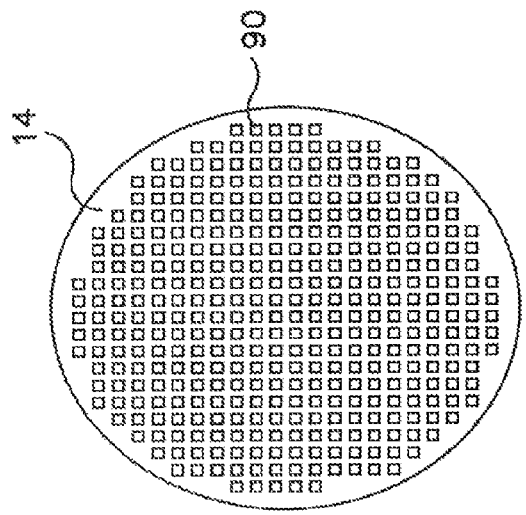

When forming the transmission area 90, it should be understood that the wafer can contain multiple areas as shown in FIG. 14 or can contain a single transmission area that covers the entire wafer as shown in FIG. 15.

When incorporating the calibration wafer illustrated in FIG. 17 or 18, in one embodiment, it may be preferable to orient the wafer such that the thin member 82 is oriented upside down so that the thin member faces the pyrometer being calibrated. This configuration can be advantageous because the pyrometer would view an opaque homogeneous surface, rather than an array of holes.

Figure 19:

Referring to FIG. 19, another embodiment of a calibration wafer 14 is illustrated. In this embodiment, the calibration wafer 14 includes a thin silicon layer 100 placed on top of a transparent substrate 102. For instance, the transparent substrate can be aluminum oxynitride, spinel, fused silica or sapphire. The result is a strong calibration wafer that has the performance of a very thin silicon material.

The silicon layer 100 can be placed on the transparent material in a number of different ways. For instance, the silicon layer can be bonded to the transparent material or, alternatively, the silicon layer can be formed by deposition on top of the transparent material.

Figure 20:
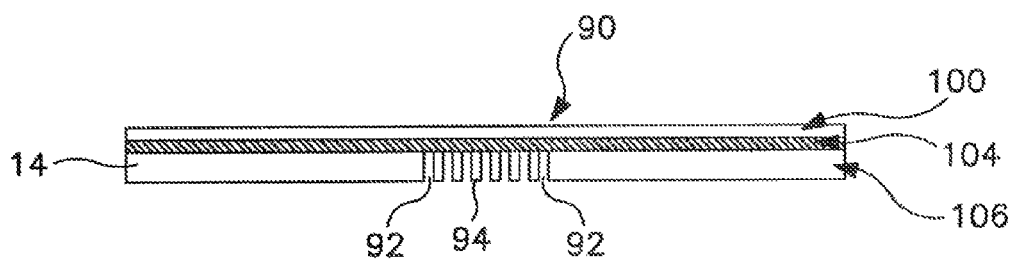

Referring to FIG. 20, another embodiment of a calibration wafer 14 is shown. In this embodiment, the calibration wafer 14 includes a thin silicon layer 100 placed on top of a silicon substrate 106. The silicon layer 100 is isolated from the silicon substrate 106 by an insulator layer 104. Insulator layer 104 can be made from an oxide, such as silicon dioxide. As shown, the calibration wafer 14 further includes a transmission area 90 containing channels 92 formed into the silicon substrate 106.

Figure 21:
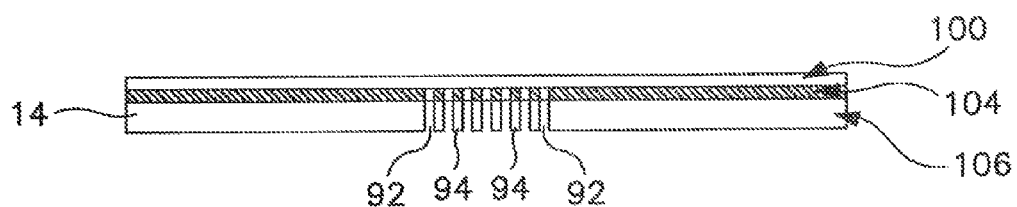

Referring to FIG. 21, a similar embodiment of a calibration wafer 14 to that shown in FIG. 20 is presented. In FIG. 21, however, the channels 92 are formed through the oxide layer 104.

In the embodiments illustrated in FIGS. 16, 17, 18, 20 and 21, a silicon wafer acts as a support for the transmission areas 90. Instead of being made from silicon, however, the support substrate can be made from other materials. For example, in one embodiment, the substrate can be made from silicon carbide which would give advantages in terms of strength, high thermal conductivity, chemical durability and mechanical durability.

In another embodiment of the present invention, the calibration wafer can include opaque areas made from a substantially opaque material and transmissive areas made from, for instance, silicon. This type of calibration wafer may be well suited for use in low temperature calibrations. In this embodiment, the pyrometer being calibrated can be positioned to sense thermal radiation being emitted by the wafer in the opaque areas. The transmission measurements, however, can be taken in the transmissive areas.

Substantially opaque materials that can be used to construct the wafer include silicon doped with a material, such as boron, arsenic, or phosphorous. Other examples of substantially opaque materials include metal films such as titanium films, cobalt films, nickel films, and tungsten films, and films made from metal silicides such as titanium silicide, cobalt silicide, nickel silicide and tungsten silicide. Some other conducting materials, such as titanium nitride could also be used.

As stated above, in some applications, it may be desirable to know the ratio between the thick and the thin areas of transmission areas 90. In one embodiment, however, this information may not be needed as long as the thick areas are opaque at the low temperature used for normalizing the signal in the infra-red transmission method. This configuration would eliminate the need for separate measurement, since the method would be self-correcting. Opacity could be measured by several methods. For instance, in one embodiment, normalization of the signal can occur at a temperature where it is known that the thick sections are opaque but the thin ones are completely transparent. Alternatively, a coating can be applied to the thick areas, where the coating is strongly absorbing or strongly reflecting at the chosen probe wavelength. Another technique would be to heavily dope the thick regions, for example by ion-implantation.

In one embodiment, the calibration wafer can be made predominantly from a material that is opaque at the normalization temperature. The wafer can then include a thin coating of silicon, similar to the wafer shown in FIG. 19. In this embodiment, the support wafer can be made from any suitable material that is opaque at the wavelength of interest, such as being made from a heavily doped material.

In another embodiment of the present invention, different calibration wafers can be used that are made from different materials. Using different materials may allow more measurements to be taken at a wider range of temperatures. The other materials that can be used include silicon carbide, aluminum nitride, gallium nitride or gallium phosphide. In particular, a material for construction of the calibration wafer can be chosen that is transparent for the IR transmission wavelength yet is opaque at the pyrometer wavelength.

For purposes of illustration, below is a table which lists some practical temperature ranges at three proposed wavelengths and three proposed wafer thicknesses. In this embodiment, the "low T" heading represents a practical lower temperature within the range for any given wavelength/thickness combination and the "high T" heading represents the upper temperature limit for the same combination. The lower temperature limit, in this embodiment, was set by diminishing temperature sensitivity. In particular, the lower limit represents the temperature at which the transmitted light signal will no longer vary by at least 0.1% of its value per 1° C. change (represented as sens(%/° C.)). The upper limit, on the other hand, was set at a point where the wafer became very opaque. In this embodiment, the high temperature range was at a point where the wafer no longer transmitted light energy at least at a rate of $10^{-8}$ transmission (1 part in 100,000,000). In the table, this is indicated as "int trans". The wavelengths 1310 nm and 1550 nm were chosen since they are convenient for commercial light sources. The wavelength of 1200 nm was an arbitrary choice.

| Wafer Thickness (Microns) | | Wavelength (nm) | | | | | |
|---|---|---|---|---|---|---|---|
| | | 1200 | | 1310 | | 1550 | |
| | | Low T | High T | Low T | High T | Low T | High T |
| 725 | T (° C.) | 125 | 600 | 360 | 745 | 415 | 885 |
| | int trans | 0.96 | 9.283E−09 | 0.943 | 1.08E−08 | 0.95 | 1.29E−08 |
| | sens (%/° C.) | 0.1 | 14 | 0.1 | 15.6 | 0.1 | 15.9 |
| 100 | T (° C.) | 250 | 975 | 425 | 1060 | 560 | 1160 |
| | int trans | 0.93 | 1.192E−08 | 0.95 | 1.53E−08 | 0.93 | 1.37E−08 |
| | sens (%/° C.) | 0.1 | 7.9 | 0.1 | 9.1 | 0.1 | 10.8 |
| 60 | T (° C.) | 300 | 1085 | 460 | 1165 | 600 | 1250 |
| | int trans | 0.92 | 1.536E−08 | 0.94 | 1.15E−08 | 0.93 | 1.53E−08 |
| | sens (%/° C.) | 0.1 | 7 | 0.1 | 8 | 0.1 | 9.5 |

Calibration Procedures

Different methods for carrying out the process of the present invention will now be discussed. In one embodiment, for instance, a selected calibration wafer is loaded into the thermal processing chamber. A calibration recipe is then run. The recipe causes the wafer to be heated through a predetermined temperature-timed cycle while the data required is acquired. The data can include pyrometer readings and infra-red transmission data. An algorithm as described above interprets the transmission data in terms of wafer temperature, and calculates parameters that are used to correct the pyrometer system so that the temperatures deduced from the pyrometer system match those deduced from the infra-red transmission system. Of course, besides pyrometers, the system can also be used to calibrate other temperature measurement devices.

A typical recipe can include one heating cycle or multiple heating cycles, where the wafer is ramped to a given temperature, as determined by the pyrometer system, and kept there for a fixed period of time while data is acquired before being ramped to a second temperature and so on. The recipe covers the temperature range that is to be calibrated. The recipe can include a portion at a temperature where the transmission of the wafer is known, and where it is not a strong function of temperature. This portion of the recipe allows the infra-red system to acquire the transmission signal that is used to normalize the signals, so that the effects or variations in the optics of the infra-red transmission measurement system can be eliminated.

If a coherent light source is used, this portion of the recipe may also include a slow temperature ramp or oscillation that introduces significant changes in the optical path length through the wafer. These variations alter the conditions for optical interference between the beams of light deflected from the top and bottom surfaces of the wafer and hence result in an oscillating transmission signal. The data recording system can collect this transmission data and then average over time so that the effect of the oscillation is reduced. This approach may be useful for stages in the recipe that are performed under conditions where the wafer transmissivity is high enough for multiple reflections within the wafer to be a factor.

An alternative type of recipe is to collect data dynamically through a ramp-up and/or ramp-down recipe. In this case, the ramp rate would have to be sufficiently slow for there to be negligible time lag between the output of the two measurement systems, and also for adequate signal averaging to occur to reduce experimental noise. In this embodiment, when using a wafer having thin sections, the thermal response of the thin sections in relation to the thick sections should be similar.

It may also be useful in some applications to perform a measurement using the transmission system before the calibration wafer is loaded into the chamber. The ratio of the signal with the wafer in place as compared to that without a wafer provides an estimate of the transmissivity of the wafer. The measured transmissivity of the wafer can be useful, for example, to check that the correct wafer was loaded, or to test for degradation of the wafer. The transmission signal level when there is no wafer present is also a useful indicator of the status of the optical system for transmission measurements.

In one alternative embodiment to the above procedure, more than one calibration wafer can be used, each of which can be automatically loaded into the processing system. The multiple calibration wafers can serve several purposes. For example, different wafers with different characteristics can be loaded into the thermal processing chamber to allow adequate performance in a high-temperature range as well as a low-temperature range. For example, wafers with thin areas may be used for higher temperatures. Also, the wafers can include different coatings to allow the necessary calibrations for the pyrometer system to give emissivity-independent temperature measurements.

In one application of the system of the present invention, it may be desirable to calibrate the pyrometer system at just one or at a few selected temperatures, in order to rapidly verify that the system is working properly. In this case, the calibration wafer can be loaded and a very simple recipe performed, for example ramping to one test temperature and collecting pyrometer and infra-red transmission data. This procedure can be performed routinely at user specified intervals. The data required for this procedure can be collected in order to track any drift in the pyrometer system's characteristics. Once a noticeable discrepancy is observed between the temperature measurement devices and the determined transmission temperature, the system can be recalibrated, or maintenance or chamber cleaning can be performed.

In some applications, the transmission measurement system of the present invention can also be operated during normal processing of wafers. Specifically, the system of the present invention can be used during normal processing of wafers where the wafer substrate doping is known and the wafer transmits a measurable amount of infra-red radiation. For example, the process recipe can be run and while the pyrometer is taking readings of the temperature, an algorithm checks the readings from the pyrometer against those of the IR transmission. If the difference between the readings exceeds some specified limit, that may be an indication that corrective action is needed. This method can be carried out over part or all of the specified temperature range or recipe time.

In fact, if enough information is known about the wafer being processed, the temperature measurement device in the processing chamber can be calibrated while the actual wafer is being processed. The calibration can, for example, happen in the early part of the temperature cycle, where the wafer is still at a temperature low enough for the IR transmission system to function adequately. In this application, the temperature deduced from the IR transmission can serve to improve the emissivity estimate of the wafer and hence improve the pyrometer's accuracy.

In one embodiment, the transmission measurement system of the present invention can be used to monitor process uniformity. In this embodiment, the system preferably includes multiple transmission measurement devices that can serve to measure light transmission at several locations on the wafer. During normal processing of wafers, or a test run using a special wafer, the transmission measurement system can monitor the temperature of the wafer at the multiple locations. This information can then be used to check and determine that the heating cycle programmed into the system is operating correctly at all the locations where a transmission measurement is performed. More particularly, in this embodiment, the transmission measurement system provides a real-time method for ensuring that the heating cycles are set properly. For instance, the transmission measurement system can determine the temperature profile of a heating cycle including ramp-up rates and ramp-down rates for accuracy. By maintaining the heating cycles at all the monitored locations within preset limits, process uniformity is improved, whether the process being carried out in the chamber is annealing or depositing materials on a wafer.

In principle, the heating system of the thermal processing chamber can be controlled using feedback from the temperature deduced by the infra-red transmission measurement of the present invention in a closed-loop mode. This might be useful in the case where the pyrometer system has never been calibrated before and as a result its readings are too inaccurate to allow for it to be used to control the heating cycle.

Besides being used in a closed-loop control cycle, the infra-red transmission measurement system of the present invention can also be used in an open-loop control cycle. In an open-loop control cycle, no feedback signal is used to control the light sources. Instead, the light sources are preprogrammed to run a particular heating cycle.

Use of the transmission measurement system of the present invention to determine the temperature of wafers independent of any other temperature measurement devices is particularly useful at temperatures less than about 800° C., where most wafers transmit a measurable amount of IR radiation. In this embodiment, the transmission system of the present invention can be used to monitor the temperature of the wafer being processed at lower temperatures, while the normal temperature measurement system can be used to monitor the temperature of the wafer at higher temperatures. For instance, the transmission measurement system, in this embodiment, is particularly well-suited for use in conjunction with pyrometers that are not as accurate at lower temperatures.

Ultimately, a full closed-loop control can be applied throughout the entire process cycle, from room temperature upwards, eliminating the need for an open-loop heating block that is normally used to heat a wafer up to the temperature where pyrometer control takes place. This embodiment can improve the overall process control and throughput, while reducing the effort needed to create recipes. Further, in applications where the peak process temperatures are less than about 800° C., the entire heating cycle could be controlled by the transmission measurement system of the present invention.

The presence of an in-situ transmission measurement system can also provide various other useful information during the processing of wafers. For instance, the system of the present invention is also configured to provide information as to whether or not the wafer being processed is opaque at the temperature or temperatures of interest. This information can be used to automatically select an optimal temperature measurement and control algorithms to handle, lightly-doped, heavily-doped and metalized wafers in optimal ways which account for their very different power absorption characteristics.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed:

1. A process for determining a temperature dependent optical characteristic of a wafer, comprising:

placing a wafer made of semiconductor material within a thermal processing chamber, the thermal processing chamber comprising a heating source and at least one calibrating light source;

emitting first light energy from the at least one calibrating light source on the wafer when the wafer is in a first temperature range, detecting, with at least one light detector, the amount of first light energy emitted from the at least one calibrating light source that is transmitted through or reflected from the wafer during at least one rotation of the wafer;

averaging the amount of detected first light energy transmitted through or reflected from the wafer during the at least one rotation of the wafer over a time period to obtain an averaged first light energy measurement, wherein averaging the amount of detected light energy transmitted through or reflected from the wafer during the at least one rotation of the wafer over a time period reduces an effect of interference caused by a varying thickness of the wafer;

after emitting first light energy, emitting second light energy from the at least one calibrating light source on the wafer when the wafer is in a second temperature range;

detecting, with at least one light detector, the amount of second light energy emitted from the at least one calibrating light source that is transmitted through or reflected from the wafer to obtain a second light energy measurement; and determining a temperature dependent optical characteristic of the wafer based on the averaged first light energy measurement and the second light energy measurement.

2. The process of claim 1, wherein the process further comprises determining a temperature of the wafer based upon the at least one temperature dependent optical characteristic.

3. The process of claim 1, wherein the at least one temperature dependent optical characteristic comprises a transmissivity of the wafer or a reflectivity of the wafer.

4. The process of claim 1, wherein the first temperature range is in the range of less than 500° C.

5. The process of claim 1, wherein the second temperature range is in the range of greater than 500° C.

6. The process of claim 1, wherein the second temperature range is in the range of greater than 125° C.

7. The process of claim 1, wherein the at least one light source is a coherent light source.

8. The process of claim 1, wherein the process comprises rotating the wafer in the thermal processing chamber while the first light energy is emitted from the at least one calibrating light source on the wafer.

9. The process of claim 1, wherein the time period is a time for at least one rotation of the wafer in the processing chamber.

10. The process of claim 1, wherein the first light energy is emitted onto the wafer during a temperature change of the wafer.

11. The process of claim 2, wherein the process further comprises calibrating a temperature measurement device that measures the temperature of the wafer based upon the temperature that is determined based upon the at least one temperature dependent optical characteristic.

12. The process of claim 8, wherein the process comprises rotating the wafer in the thermal processing chamber while the second light energy is emitted from the at least one calibrating light source on the wafer.

13. The process of claim 10, wherein averaging the amount of detected first light energy transmitted through or reflected from the wafer comprises averaging the amount of detected first light energy transmitted through or reflected from the wafer during the temperature change.

14. The process of claim 10, wherein the temperature change comprises a ramp up of wafer temperature.

* * * * *